United States Patent
Choi et al.

(10) Patent No.: US 10,263,010 B2
(45) Date of Patent: Apr. 16, 2019

(54) SEMICONDUCTOR DEVICE AND MANUFACTURING METHOD THEREOF

(71) Applicant: SK hynix Inc., Gyeonggi-do (KR)

(72) Inventors: Kang Sik Choi, Gyeonggi-do (KR); Bong Hoon Lee, Seoul (KR); Seung Cheol Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/865,669

(22) Filed: Jan. 9, 2018

(65) Prior Publication Data
US 2018/0366488 A1   Dec. 20, 2018

(30) Foreign Application Priority Data
Jun. 16, 2017  (KR) .......................... 10-2017-0076698

(51) Int. Cl.
| | | |
|---|---|---|
| *H01L 27/148* | (2006.01) | |
| *H01L 21/338* | (2006.01) | |
| *H01L 27/11582* | (2017.01) | |
| *H01L 29/423* | (2006.01) | |
| *G11C 16/04* | (2006.01) | |
| *H01L 27/11556* | (2017.01) | |
| *H01L 29/66* | (2006.01) | |
| *H01L 27/11521* | (2017.01) | |
| *H01L 29/788* | (2006.01) | |
| *G11C 5/06* | (2006.01) | |

(52) U.S. Cl.
CPC ........ *H01L 27/11582* (2013.01); *G11C 5/063* (2013.01); *G11C 16/0483* (2013.01); *H01L 27/11521* (2013.01); *H01L 27/11556* (2013.01); *H01L 29/42328* (2013.01); *H01L 29/66825* (2013.01); *H01L 29/66833* (2013.01); *H01L 29/788* (2013.01)

(58) Field of Classification Search
CPC ......... H01L 27/11551; H01L 27/11556; H01L 27/11521; H01L 27/11582; H01L 27/2481; H01L 27/2454; H01L 27/11273; H01L 29/7926; H01L 29/7889; H01L 2924/145
USPC ........ 257/220, 263, 328, 330, 331; 438/156, 438/173, 192, 212, 268
See application file for complete search history.

(56) References Cited

U.S. PATENT DOCUMENTS 9,627,405 B1 * 4/2017 Lee .................... H01L 27/1158
2018/0366483 A1   12/2018 Choi

FOREIGN PATENT DOCUMENTS

| KR | 1020160020210 | 2/2016 |
|---|---|---|
| KR | 1020170065290 | 6/2017 |
| KR | 1020180137272 | 12/2018 |

* cited by examiner

*Primary Examiner* — Hsien Ming Lee
(74) *Attorney, Agent, or Firm* — IP & T Group LLP

(57) ABSTRACT

A semiconductor device includes a first semiconductor layer, a second semiconductor layer spaced apart from the first semiconductor layer and disposed on the first semiconductor layer, a gate stack structure disposed on the second semiconductor layer, a third semiconductor layer positioned between the first and second semiconductor layers, and a channel pillar passing through the gate stack structure, the second semiconductor layer and the third semiconductor layer and extending into the first semiconductor layer.

18 Claims, 24 Drawing Sheets

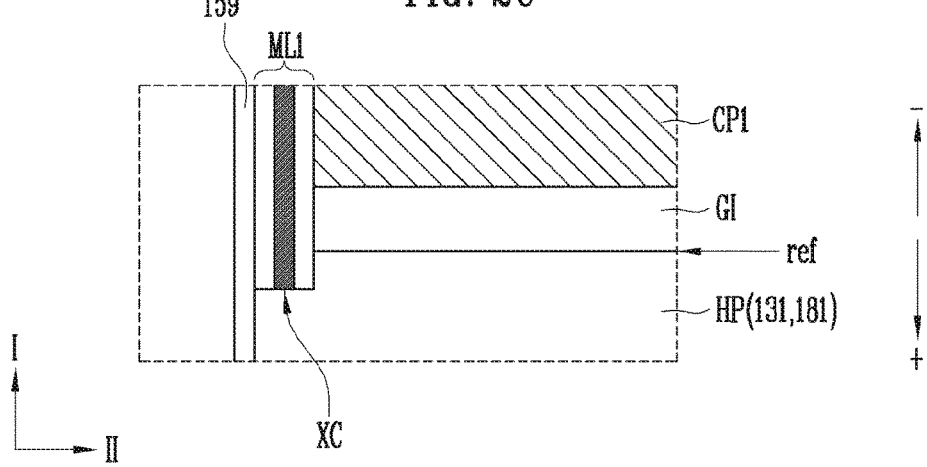
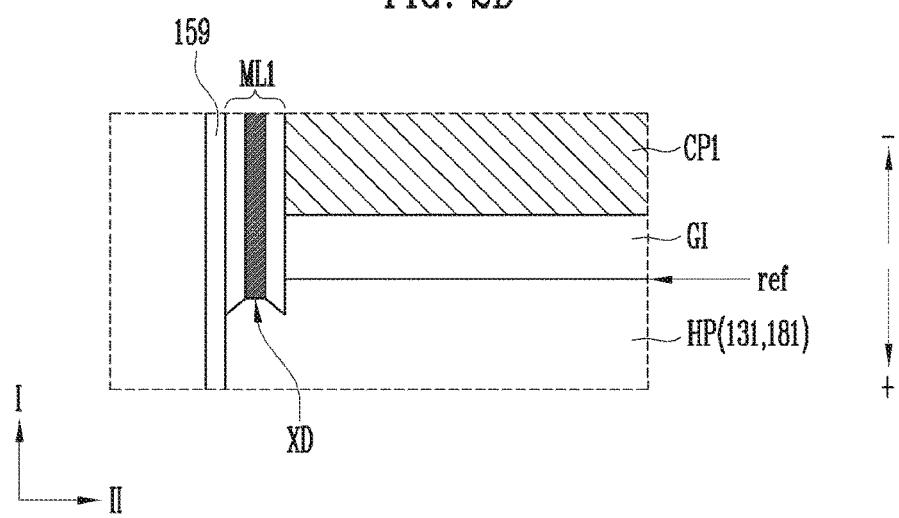
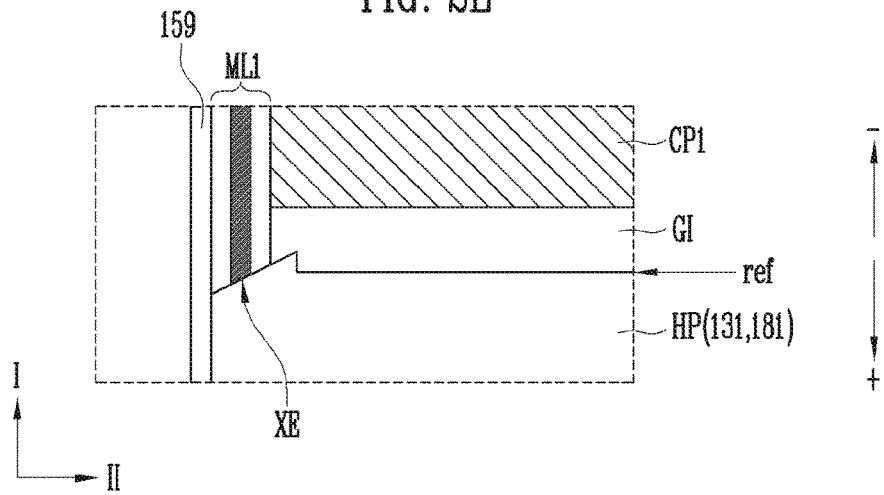

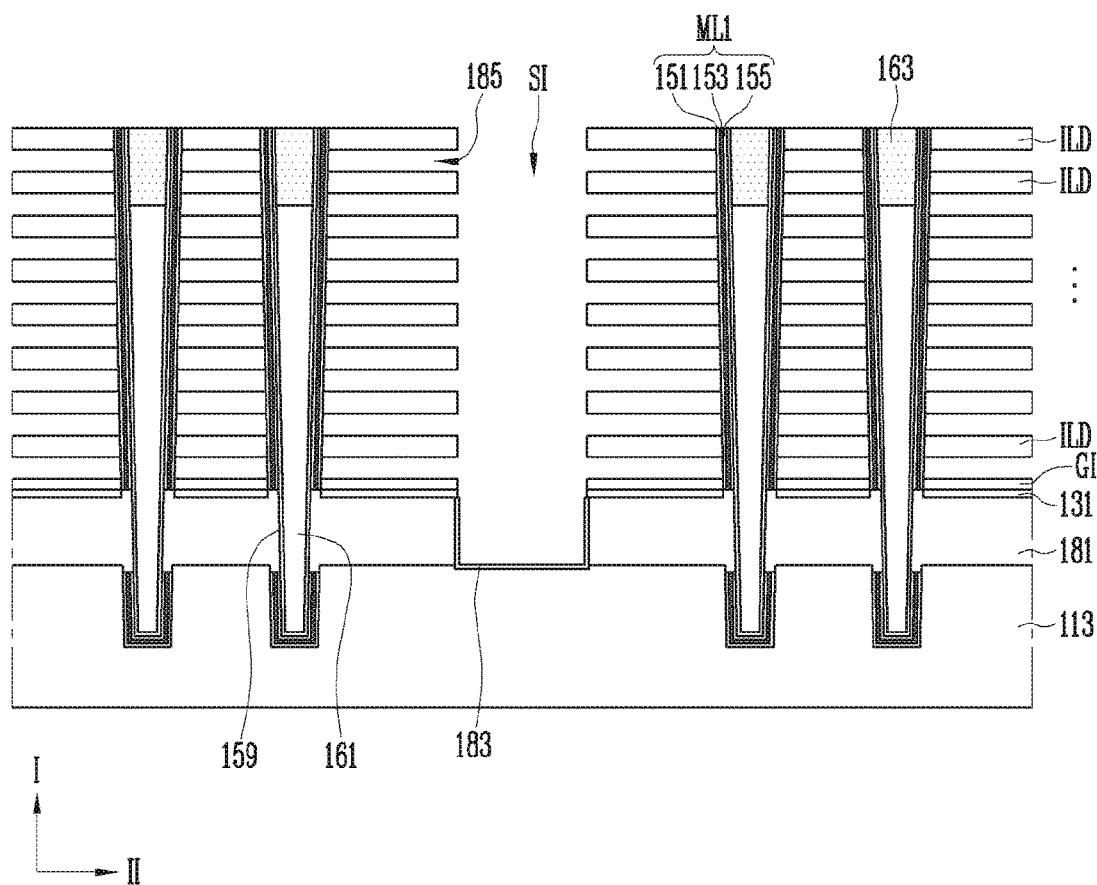

US 10,263,010 B2

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2017-0076698, filed on Jun. 16, 2017, the entire disclosure of which is herein incorporated by reference in its entirety.

BACKGROUND

Field of Invention

Various embodiments of the invention relate generally to a semiconductor device and a manufacturing method thereof and, more particularly, to a three-dimensional semiconductor device and a manufacturing method thereof.

Description of Related Art

A semiconductor device may include a plurality of memory cells capable of storing data. These memory cells may be coupled in series between select transistors to form a plurality of memory strings. To increase the integration density of the semiconductor device, the memory strings may be arranged in three dimensions. Although three-dimensional semiconductor devices are well known, significant research and development efforts continue to focus in improving the operational reliability of three-dimensional semiconductor devices by the development of novel manufacturing techniques for making the three-dimensional semiconductor devices.

SUMMARY

The present invention is generally directed to an improved manufacturing method for making a three-dimensional semiconductor memory device.

According to an embodiment of the present invention, a semiconductor device may include a first semiconductor layer, a second semiconductor layer spaced apart from the first semiconductor layer and disposed on the first semiconductor layer, a gate stack structure disposed on the second semiconductor layer, a third semiconductor layer positioned between the first and second semiconductor layers, and a channel pillar passing through the gate stack structure, the second semiconductor layer and the third semiconductor layer and extending into the first semiconductor layer. The third semiconductor layer may be in contact with the channel pillar and may include a first protrusion protruding in an interface between the second semiconductor layer and the channel pillar.

According to an embodiment, a manufacturing method for a semiconductor device may include sequentially stacking a first semiconductor layer, a sacrificial group and a second semiconductor layer, stacking first material layers and second material layers alternately over the second semiconductor layer, forming channel pillars in first and second groups, wherein each of the channel pillars passes through the first and second material layers, extends into the first semiconductor layer and is surrounded by a multilayer memory layer, forming a slit through the first material layers and the second material layers between the channel pillars of the first group and the channel pillars of the second group, removing the sacrificial group and a portion of the multi-layer memory layer to define a horizontal space through which each of the channel pillars in the first and second groups is exposed between the first semiconductor layer and the second semiconductor layer, wherein the horizontal space includes first annular grooves extending between the second semiconductor layer and the channel pillars in the first and second groups, and forming a third semiconductor layer filling the first annular grooves and the horizontal space and contacting the channel pillars in the first and second groups.

BRIEF DESCRIPTION OF THE DRAWINGS

FIGS. 2A to 2E are cross-sectional diagrams illustrating various structures in comparison with the structure corresponding to an area A as shown in FIG. 1.

FIGS. 5A to 5M are cross-sectional diagrams illustrating a manufacturing method for a semiconductor device, according to an embodiment of the present invention.

DETAILED DESCRIPTION

Figure 1:
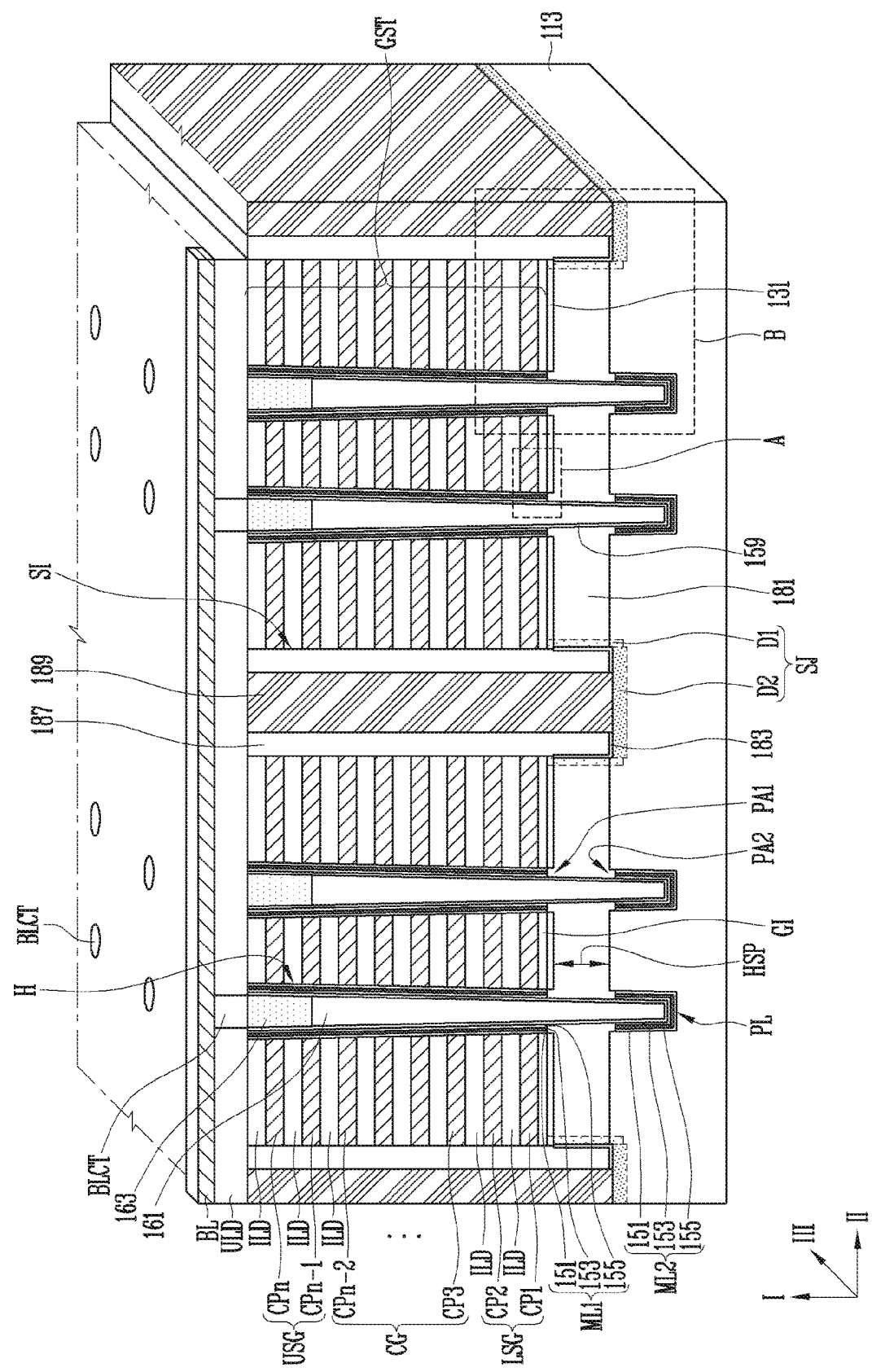
FIG. 1 is a diagram illustrating a semiconductor device, according to an embodiment of the present invention.

Hereinafter, various embodiments of the present invention will be described with reference to the accompanying drawings. In the drawings, illustrated thicknesses of various components and distances between components may be exaggerated as compared to actual physical thicknesses and intervals for convenience of illustration. Also, in the following description, detailed explanation of known related functions and constitutions may be omitted to avoid unnecessarily obscuring the subject matter disclosed herein. Like reference numerals refer to like elements throughout the specification and drawings.

Various embodiments are directed to a semiconductor device capable of improving operational reliability of a three-dimensional semiconductor device and a method of manufacturing the same.

FIG. 1 is a diagram illustrating a semiconductor device, according to an embodiment of the invention.

Referring to FIG. 1, a semiconductor device according to an embodiment may include semiconductor layers 113, 181, and 131 stacked in a first direction I, gate stack structures GST including a plurality of layers GI, CP1 to CPn, and ILD stacked in the first direction I, cell plugs PL passing through the gate stack structures GST and the semiconductor layers 131, and 181, and extending into the semiconductor layer 113, a slit SI separating the gate stack structures GST from each other, a source contact layer 189 formed in the slit SI, and a bit line BL electrically coupled to at least one of the cell plugs PL.

The semiconductor layers 113, 181, and 131 may include a first semiconductor layer 113, a third semiconductor layer 181 and a second semiconductor layers 131 stacked sequentially in the first direction I. Each of the first and third semiconductor layers 113 and 181 may include a dopant of a first conductivity type. The second semiconductor layer 131 may include a dopant of a first conductivity type, or may be an undoped semiconductor layer.

More specifically, each of the first and third semiconductor layers 113 and 181 may include a p-type dopant to supply holes to a channel area during an erase operation of the semiconductor device. For example, each of the first and third semiconductor layers 113 and 181 may be a p-type doped silicon layer.

The second semiconductor layer 131 may be a p-type doped semiconductor layer or may be an undoped semiconductor layer. The second semiconductor layer 131 may include a p-type dopant at a lower concentration than that of the each of the first and third semiconductor layer 113 and 181. The second semiconductor layer 131 may supply holes to a channel area during an erase operation of the semiconductor device. By having a lower concentration p-type dopant, the second semiconductor layer 131 may reduce a threshold voltage of a source select transistor. Alternatively, the second semiconductor layer 131 may include an undoped semiconductor layer.

The first semiconductor layer 113 may extend in a second direction II and a third direction III. The first and third directions may perpendicularly intersect each other. The plane defined by the second and third directions II and III may perpendicularly cross the first direction I. The first semiconductor layer 113 may extend in the second and third directions II and III to overlap the gate stack structures GST forming a single memory block. Though not shown in FIG. 1, the first semiconductor layer 113 may be separated into a plurality of patterns to each of which a voltage is applied. The concentration of the dopant of the first conductivity type may decrease toward an upper part of the first semiconductor layer 113, close to the gate stack structure GST, and increase toward a lower part thereof distant from the gate stack structure GST.

The second semiconductor layer 131 may be disposed over the first semiconductor layer 113. The second semiconductor layer 131 may be disposed under the gate stack structures GST to overlap the gate stack structures GST. The second semiconductor layer 131 may be separated from the first semiconductor layer 113 in the first direction I. Spaces between the first semiconductor layer 113 and the second semiconductor layer 131 may be defined as horizontal spaces HSP.

Each of the third semiconductor layers 181 may fill each of the horizontal spaces HSP. The slit SI may extend between the third semiconductor layers 181 to separate the third semiconductor layers 181 from each other. Each of the third semiconductor layers 181 may include a first protrusion PA1 which protrudes in the first direction I. Each of the third semiconductor layers 181 may further include a second protrusion PA2 protruding in a direction opposite to the first protrusion PA1.

Each of the gate stack structures GST may be disposed on each of the second semiconductor layers 131. Each of the gate stack structures GST may include a gate insulating layer GI, conductive patterns CP1 to CPn and interlayer insulating layers ILD stacked alternately on the gate insulating layer GI. The gate insulating layer GI may contact the second semiconductor layer 131. The conductive patterns CP1 to CPn may be separated from and stacked over each other in the first direction I. The interlayer insulating layers ILD may be respectively arranged between the conductive patterns CP1 to CPn. The gate insulating layer GI may have a smaller thickness than each of the interlayer insulating layers ILD. The conductive patterns CP1 to CPn may be divided into a lower select gate group LSG, a cell gate group CG, and an upper select gate group USG.

The lower select gate group LSG may include a conductive pattern in a single layer or conductive patterns in two or more layers adjacent to the second semiconductor layer 131. For example, the lower select gate group LSG may include a first conductive pattern CP1 closest to the second semiconductor layer 131, among the conductive patterns CP1 to CPn, and a second conductive pattern CP2 arranged above the first conductive pattern CP1. The lower select gate group LSG may serve as a source select line coupled to a gate of a source select transistor.

In comparison with the lower select gate group LSG, the upper select gate group USG may be more distant from the second semiconductor layer 131. The upper select gate group USG may include a conductive pattern in a single layer or conductive patterns in two or more layers adjacent to the bit line BL. For example, the upper select gate group USG may include an nth conductive pattern CPn the farthest from the second semiconductor layer 131, among the conductive patterns CP1 to CPn, and an (n−1)th conductive pattern CPn−1 arranged under the nth conductive pattern CPn. The upper select gate group USG may serve as a drain select line coupled to a gate of a drain select transistor.

The cell gate group CG may be arranged above the lower select gate group LSG and under the upper select gate group USG. In other words, the cell gate group CG may include the conductive patterns arranged between the lower select gate group LSG and the upper select gate group USG. For example, the cell gate group CG may include third to (n−2)th conductive patterns CP3 to CPn−2. The conductive patterns forming the cell gate group CG may serve as word lines coupled to gates of memory cell transistors.

As described above, the conductive patterns CP1 to CPn of the gate stack structure GST may serve as gate electrodes coupled to gates of a source select transistor, memory cell transistors and a drain select transistor. The interlayer insulating layers ILD may insulate the gate electrodes from each other, or insulate the gate electrodes from the bit line BL. The conductive patterns CP1 to CPn may include at least one of silicon, metal and metal silicide. The interlayer insulating layers ILD may include oxides.

The cell plugs PL may pass through the gate stack structures GST and the semiconductor layers 131 and 181 at both sides of the slit SI and extend into the semiconductor layer 113. Each of the cell plugs PL may include a channel pillar 159, a first multilayer memory pattern ML1, a second multilayer memory pattern ML2 and a capping pattern 163.

The channel pillar 159 may pass through the gate stack structure GST and the semiconductor layers 131 and 181 and extend into the first semiconductor layer 113. The channel pillar 159 may include a semiconductor layer. For example, the channel pillar 159 may include a silicon layer. The channel pillar 159 may pass through the second semiconductor layer 131 and the third semiconductor layer 181 and include a sidewall directly contacting the third semiconductor layer 181. The sidewall of the channel pillar 159 may directly contact a sidewall of the third semiconductor layer 181 disposed in the horizontal space HSP, the first protrusion PA1 of the third semiconductor layer 181 which protrudes toward the gate stack structure GST, and the second protrusion PA2 which protrudes toward the first semiconductor layer 113. The channel pillar 159 may completely fill a central area of a hole H passing through the gate stack structure GST. In another example, the channel pillar 159 may be a thin film which surrounds a core insulating layer 161 filling the central area of the hole H. The core insulating layer 161 may have a smaller height than the channel pillar 159.

The capping pattern 163 may be disposed on the core insulating layer 161 and fill a top central portion of the channel pillar 159. The capping pattern 163 may directly contact the channel pillar 159. The capping pattern 163 may include a dopant of a second conductivity type. The second conductivity type may be different from the first conductivity type. The dopant of the second conductivity type may be an n-type dopant. More specifically, the capping pattern 163 may be an n-type doped silicon layer. The capping pattern 163 may serve as a drain junction.

The first multilayer memory pattern ML1 and the second multilayer memory pattern ML2 may surround the channel pillar 159. The first multilayer memory pattern ML1 and the second multilayer memory pattern ML2 may be separated from each other by the third semiconductor layer 181. Each of the first multilayer memory pattern ML1 and the second multilayer memory pattern ML2 may include a tunnel insulating layer 155, a data storage layer 153 and a blocking insulating layer 151 sequentially stacked on each other. The tunnel insulating layer 155, the data storage layer 153 and the blocking insulating layer 151 of the first multilayer memory pattern ML1 may be disposed sequentially from the channel pillar 159 toward the gate stack structure GST. The tunnel insulating layer 155, the data storage layer 153, and the blocking insulating layer 151 of the second multilayer memory pattern ML2 may be disposed sequentially from the channel pillar 159 toward the first semiconductor layer 113.

The tunnel insulating layer 155 may include an insulating material enabling charge tunneling, for example, a silicon oxide layer.

The data storage layer 153 may store data being changed by using Fowler-Nordheim tunneling induced by the voltage difference between the channel pillar 159 and word lines (e.g., CP3 to CPn−2) included in the cell gate group CG. The data storage layer 153 may include various materials, for example, a nitride layer capable of trapping charges. The data storage layer 153 may also include nanodots, silicon for a floating gate, and a phase change material having a variable resistance.

The blocking insulating layer 151 may include an oxide layer capable of blocking charges. For example, the blocking insulating layer 151 may include a high dielectric layer such as an aluminum oxide layer or a hafnium oxide layer.

A portion of the first multilayer memory pattern ML1 disposed between the upper select gate group USG and the channel pillar 159 and a portion of the first multilayer memory pattern ML1 disposed between the lower select gate group LSG and the channel pillar 159 may serve as gate insulating layers. The second multilayer memory pattern ML2 may serve as an insulating layer which insulates the first semiconductor layer 113 and the channel pillar 159 from each other.

The first multilayer memory pattern ML1 may extend along an interface between the channel pillar 159 and the gate stack structure GST. The first multilayer memory pattern ML1 surrounding the channel pillar 159 may have a bottom surface contacting the first protrusion PA1 of the third semiconductor layer 181.

The second multilayer memory pattern ML2 may extend along the interface between the channel pillar 159 and the first semiconductor layer 113. The second multilayer memory pattern ML2 surrounding the channel pillar 159 may have a top surface contacting the second protrusion PA2.

The first protrusion PA1 of the third semiconductor layer 181 may extend between the second semiconductor layer 131 and the channel pillar 159 and directly contact the second semiconductor layer 131 and the channel pillar 159. The second protrusion PA2 of the third semiconductor layer 181 may extend between the first semiconductor layer 113 and the channel pillar 159 and directly contact the first semiconductor layer 113 and the channel pillar 159.

The slit SI may be disposed between the gate stack structures GST. The slit SI may be extend toward the first semiconductor layer 113 to be coupled to the horizontal space HSP. A source junction SJ may be formed in the first, second, and third semiconductor layers 113, 131, and 181. The source junction SJ may be formed along surfaces of the first, second, and third semiconductor layers 113, 131, and 181 which are adjacent to the slit SI. The source junction SJ may include a dopant of a second conductivity type different from the first conductivity type. The dopant of the second conductivity type may be an n-type dopant.

The source junction SJ may include a first region D1 and a second region D2. The first region D1 may include a dopant of a second conductivity type at a first concentration. The second region D2 may include a dopant of a second conductivity type at a second concentration which is higher than the first concentration. The second region D2 may be defined as the region in the first semiconductor layer 113 which is adjacent to the slit SI. The first region D1 may be defined as the region between the inside of the first semiconductor layer 113 adjacent to the second region D2 and the insides of the second and third semiconductor layers 131 and 181 which are adjacent to a sidewall of the slit SI.

A spacer insulating layer 187 may be formed on the sidewall of the slit SI. The spacer insulating layer 187 may extend along a sidewall of the gate stack structure GST, a sidewall of the second semiconductor layer 131 and the sidewall of the third semiconductor layer 181. The thickness of the spacer insulating layer 187 may vary but should have a sufficient thickness to insulate the source contact layer 189 from the gate stack structure GST. In an embodiment, the spacer insulating layer 187 may be an oxide layer.

As further illustrated in FIG. 1, a buffer layer 183 may be formed between the spacer insulating layer 187 and the source junction SJ. The buffer layer 183 may be an oxide layer. The channel pillar 159 disposed between the source junction SJ and the capping pattern 163 serving as a drain junction may serve as a channel area, together with the second semiconductor layer 131, during operations of the semiconductor device. In the channel area, a current path may be provided according to a voltage level of a voltage applied to the conductive patterns CP1 to CPn.

The source contact layer 189 is formed on the spacer insulating layer 187 and completely fills the slit SI and is in direct contact with the second region D2 of the source junction SJ which is formed inside the first semiconductor layer 113. The source contact layer 189 may be made of various suitable conductive materials such as a silicide layer, a metal layer, and a doped silicon layer. The source junction SJ is an area where the dopant of the second conductivity type is diffused into the first, second, and third semiconductor layers 113, 131, and 181 from the surfaces of the first, second, and third semiconductor layers 113, 131, and 181 adjacent to the source contact layer 189 and the spacer insulating layer 187.

The bit line BL may be coupled to the plurality of cell plugs PL which are arranged next to each other in one direction. Alternatively, the bit line BL may be coupled to even or odd cell plugs PL, among the plurality of cell plugs PL arranged next to each other in one direction. Although FIG. 1 shows the single bit line BL, two or more bit lines may be formed.

The bit line BL may be electrically coupled to the channel pillar 159 and the capping pattern 163 via a bit line contact plug BLCT coupled to the cell plug PL. The bit line contact plug BLCT may pass through an upper insulating layer ULD disposed between the gate stack structure GST and the bit line BL. Though not shown in FIG. 1, in another embodiment, the bit line BL may directly contact the channel pillar 159 and the capping pattern 163 of the cell plug PL.

Also, though not shown in FIG. 1, the semiconductor device may further include a circuit part (not illustrated) including driving circuits for controlling the operations of the semiconductor device. The circuit part may transfer electric signals to the gate stack structures GST, the source contact layer 189, and the bit line BL through a plurality of routing metal lines (not illustrated) and a plurality of contact plugs (not illustrated). The circuit part may be formed over a substrate (not illustrated) so as to be disposed under and overlap with the first semiconductor layer 113, or on a peripheral region of the substrate (not illustrated) which does not overlap with the first semiconductor layer 113.

According to the above-described embodiment, a source select transistor may be defined at an intersection between the lower select gate group LSG and the channel pillar 159, a memory cell transistor may be defined at an intersection between the cell gate group CG and the channel pillar 159, and a drain select transistor may be defined at an intersection between the upper select gate group USG and the channel pillar 159. Accordingly, the drain select transistor, the memory cell transistor and the source select transistor may be coupled in series between the bit line BL and the source contact layer 189 by the channel pillar 159 to form a memory string.

In the above-described structure of the semiconductor device, the shape and height of the bottom surface of the first protrusion PA1 may vary.

FIGS. 2A to 2E are cross-sectional diagrams illustrating various exemplary structures for the structure corresponding to an area A shown in FIG. 1.

Referring to FIGS. 2A to 2E, a bottom surface XA, XB, XC, XD or XE of the first multilayer memory pattern ML1 may have various shapes. The first multilayer memory pattern ML1 may extend along an interface between the channel pillar 159 and the gate stack structure including the first conductive pattern CP1 and the gate insulating layer GI. The first conductive pattern CP1 may be a lower select gate group serving as a gate electrode of a source select transistor. The first conductive pattern CP1 may be formed on the semiconductor layers (e.g., 131 and 181) serving as the horizontal portion HP in the channel area. The gate insulating layer GI may be disposed between the horizontal portion HP of the channel area and the first conductive pattern CP1. The channel pillar 159 may serve as a vertical portion of the channel area.

Figure 2A:
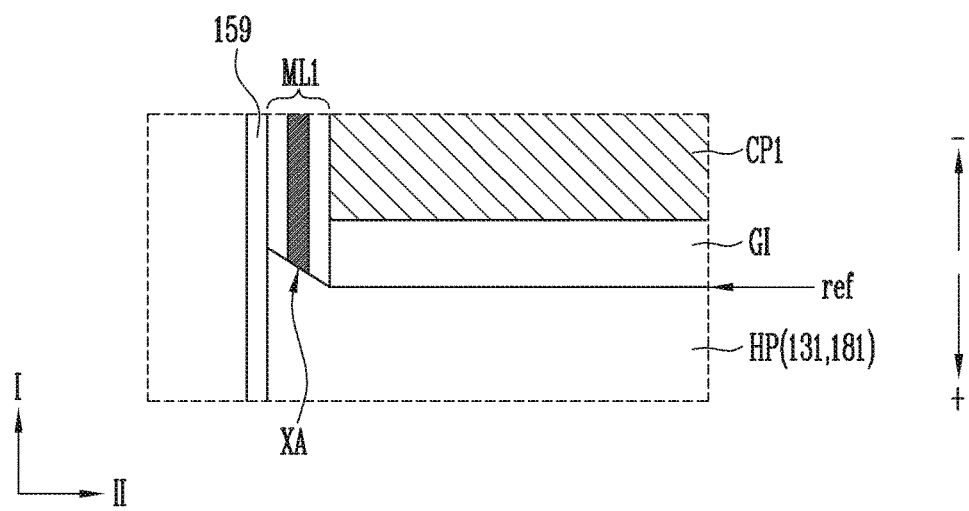

Referring to FIG. 2A, the bottom surface XA of the first multilayer memory pattern ML1 may have a side view shape of a straight line having, for example, a negative slope in a direction from the sidewall of the channel pillar 159 toward the gate insulating layer GI. A first end of the bottom surface XA line may be located at about the intersection of the bottom surface of the gate insulating layer GI and the sidewall of the channel pillar 159.

Figure 2B:
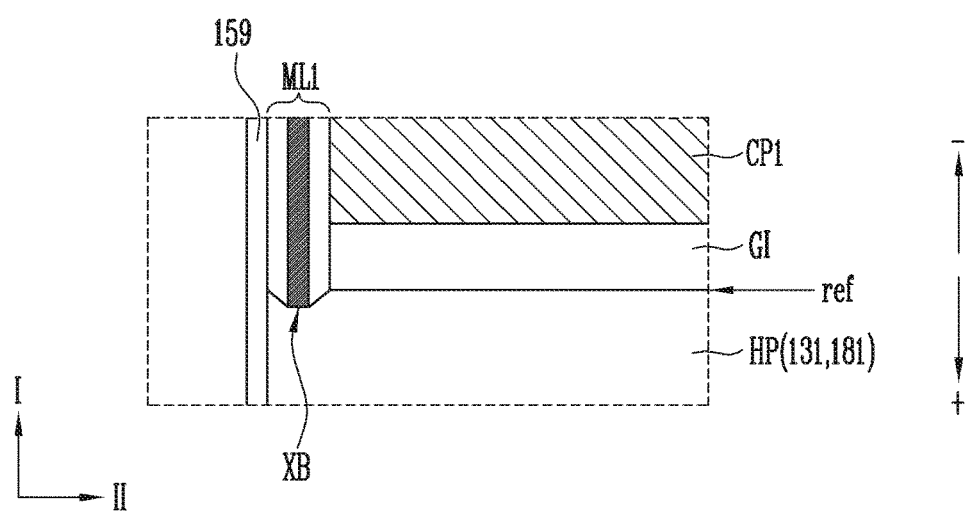

Referring to FIG. 2B, the bottom surface XB of the first multilayer memory pattern ML1 may have a side view shape of a convex polygonal line in a direction from the first conductive pattern CP1 toward the gate insulating layer GI. The convex polygonal line has a horizontal, center straight line, and inclined first and second lateral straight lines, the first lateral straight line having a negative slope and the second lateral straight line having a positive slope, in a direction from the sidewall of the channel pillar 159 toward the gate insulating layer GI. The bottom surface XB of the first multilayer memory pattern ML1 may have a convex shape in a direction from the first conductive pattern CP1 toward the gate insulating layer GI.

Referring to FIG. 2C, the bottom surface XC of the first multilayer memory pattern ML1 may have a flat (horizontal) or straight line with respect to an interface between the gate insulating layer GI and the horizontal portion HP of the channel area.

Referring to FIG. 2D, the bottom surface XD of the first multilayer memory pattern ML1 may have a side shape of a concave polygonal line in a direction from the gate insulating layer GI to the first conductive pattern CP1. The concave polygonal line has a horizontal, center straight line, and inclined first and second lateral straight lines, the first lateral straight line having a positive slope and the second lateral straight line having a negative slope, in a direction from the sidewall of the channel pillar 159 toward the gate insulating layer GI. The bottom surface XD of the first multilayer memory pattern ML1 may have a concave shape in a direction from the gate insulating layer GI to the first conductive pattern CP1.

Referring to FIG. 2E, the bottom surface XE of the first multilayer memory pattern ML1 may have a side view shape of a positive slope straight line in the direction from the sidewall of the channel pillar 159 toward the gate insulating layer GI.

The perpendicular distance between the lowest point of the bottom surface of the multilayer memory pattern ML1 and the bottom surface of the gate insulating layer GI (also referred to as the interface between the GI and HP) is referred to hereinafter as the height of the bottom surface. For convenience of explanation, on the basis of an interface ref between the horizontal portion HP of the channel area and the gate insulating layer GI, a height measured from the interface ref in a direction toward the gate insulating layer GI is defined as "−" and a height measured from the interface ref in a direction toward the horizontal portion HP of the channel area is defined as "+". Hence a height of −100 Å, for example, for the bottom surface XC would mean that the lowest point of the bottom surface is at a level of about 100 Å above the interface ref. The bottom surface XA, XB, XC, XD or XE of the first multilayer memory pattern ML1 as shown in FIGS. 2A to 2E may be controlled to have various heights.

Figure 3:
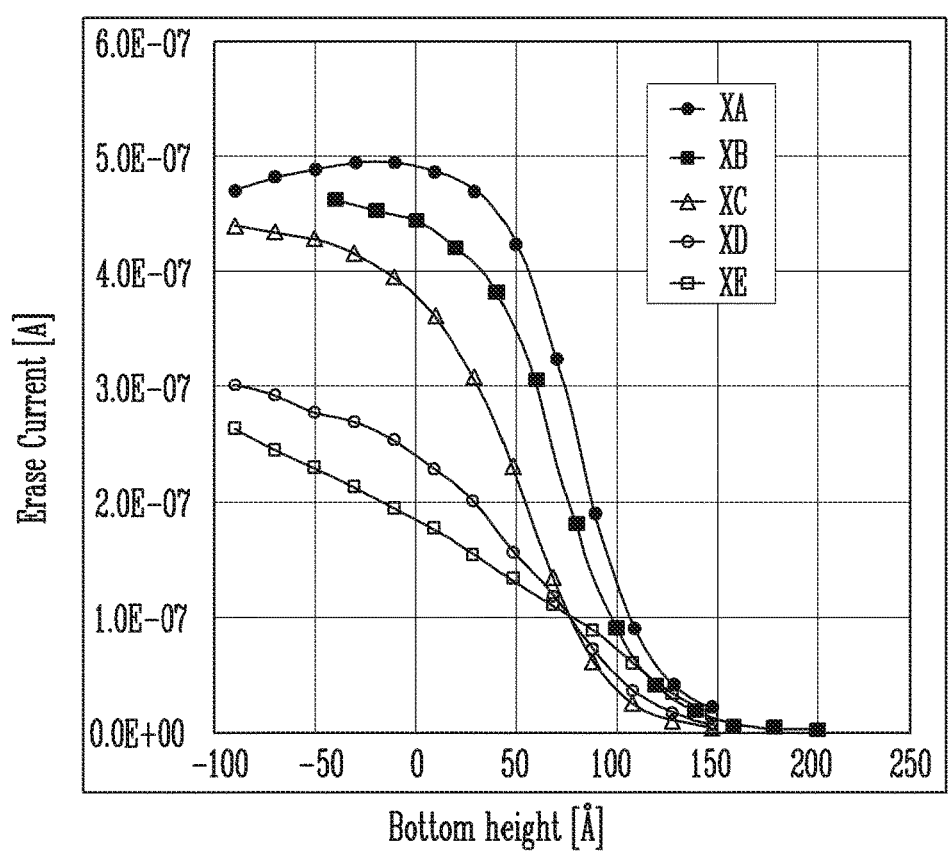
FIG. 3 is a graph illustrating an erase current of a semiconductor memory device as a function of the shape and the height of a bottom surface thereof as shown in FIGS. 2A to 2E.

FIG. 3 is a graph illustrating erase current characteristics according to the shape and the height of the bottom surface of the first multilayer memory pattern ML1 as shown in FIGS. 2A to 2E.

Referring to FIG. 3, an erase current may be increased when the bottom surface of the first multilayer memory pattern ML1 has the shape with the negative slope corresponding to XA, the convex shape corresponding to XB, and the flat shape corresponding to XC in comparison with when the bottom surface of the first multilayer memory pattern ML1 has the concave shape corresponding to XD and the shape with the positive slope corresponding to XE. In addition, when the height of the bottom surface XA, XB or XC of the first multilayer memory pattern ML1 is in a range from −100 Å to +20 Å on the basis of the reference (ref) as shown in FIGS. 2A to 2C, it may be shown that a high erase current is ensured.

According to an embodiment, the height of the bottom surface of the first multilayer memory pattern ML1 may be controlled so as to increase the erase current. Thus, the third semiconductor layer 181 may include the first protrusion PA1. As a result, according to an embodiment of the invention, erase operation characteristics of the semiconductor device may be ensured to improve operational reliability of the semiconductor device.

Figure 4A:
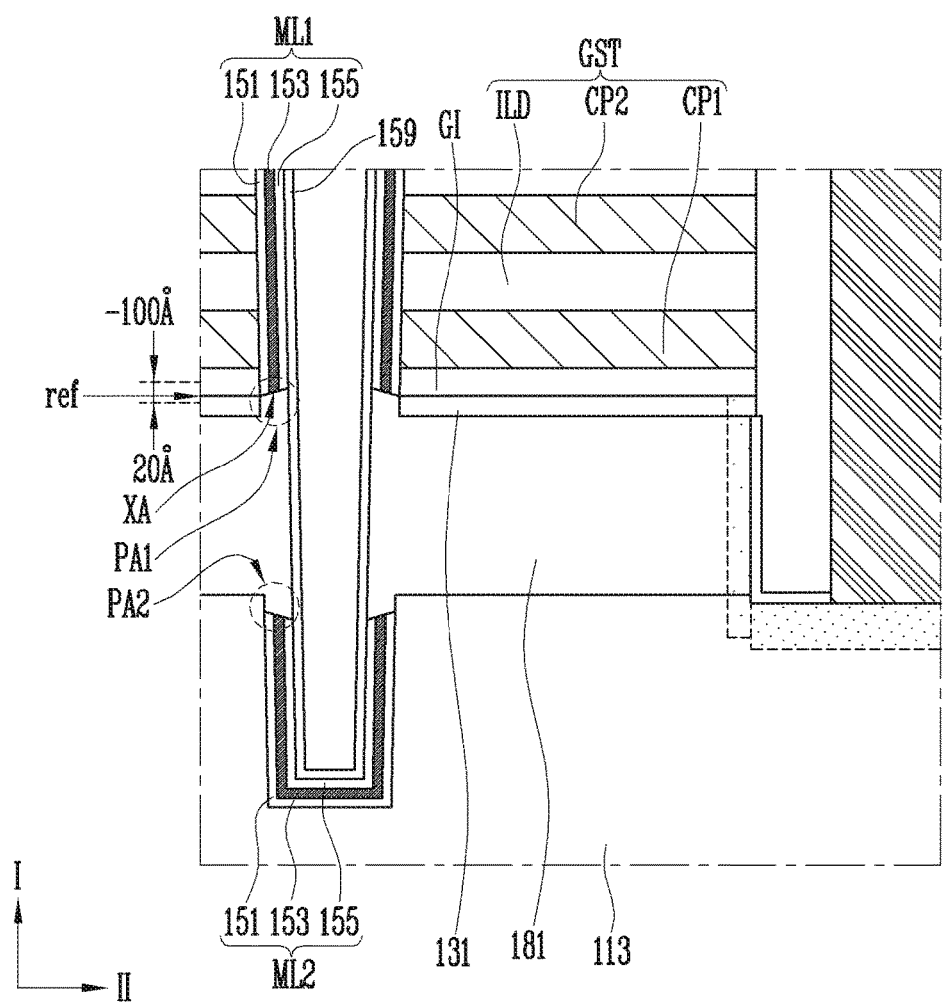
FIGS. 4A to 4C are enlarged cross-sectional diagrams of various embodiments of an area B shown in FIG. 1.
Figure 4B:
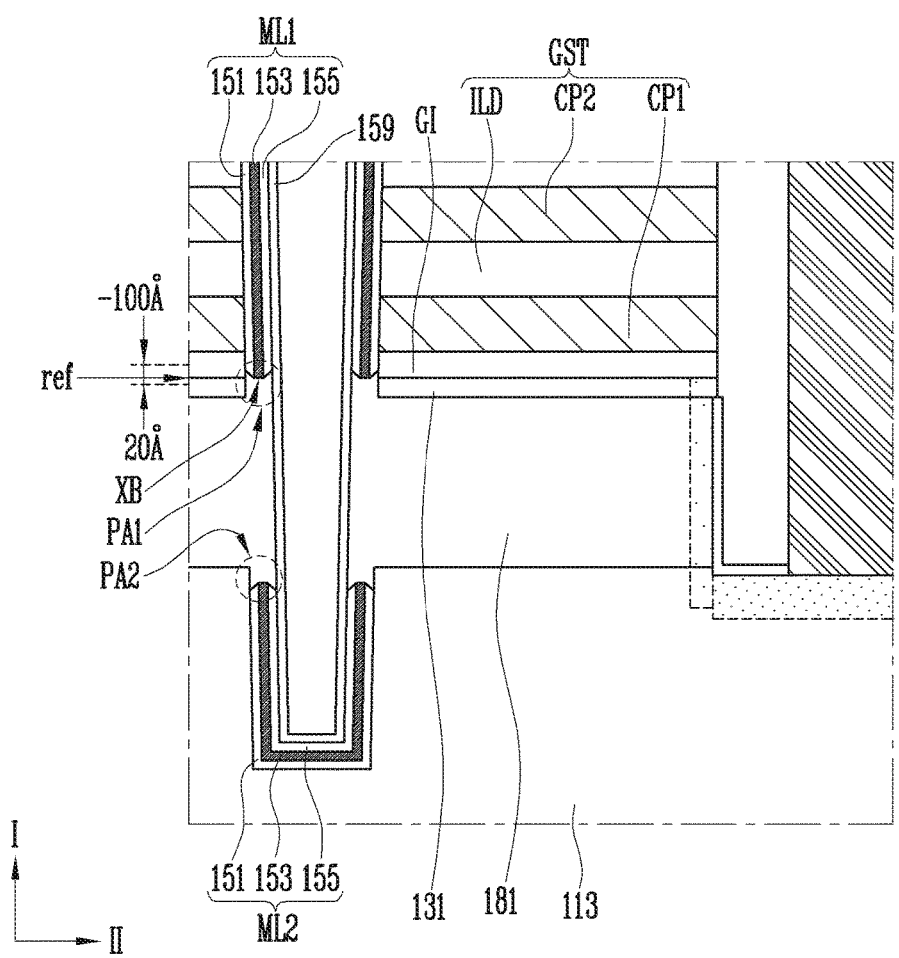
Figure 4C:
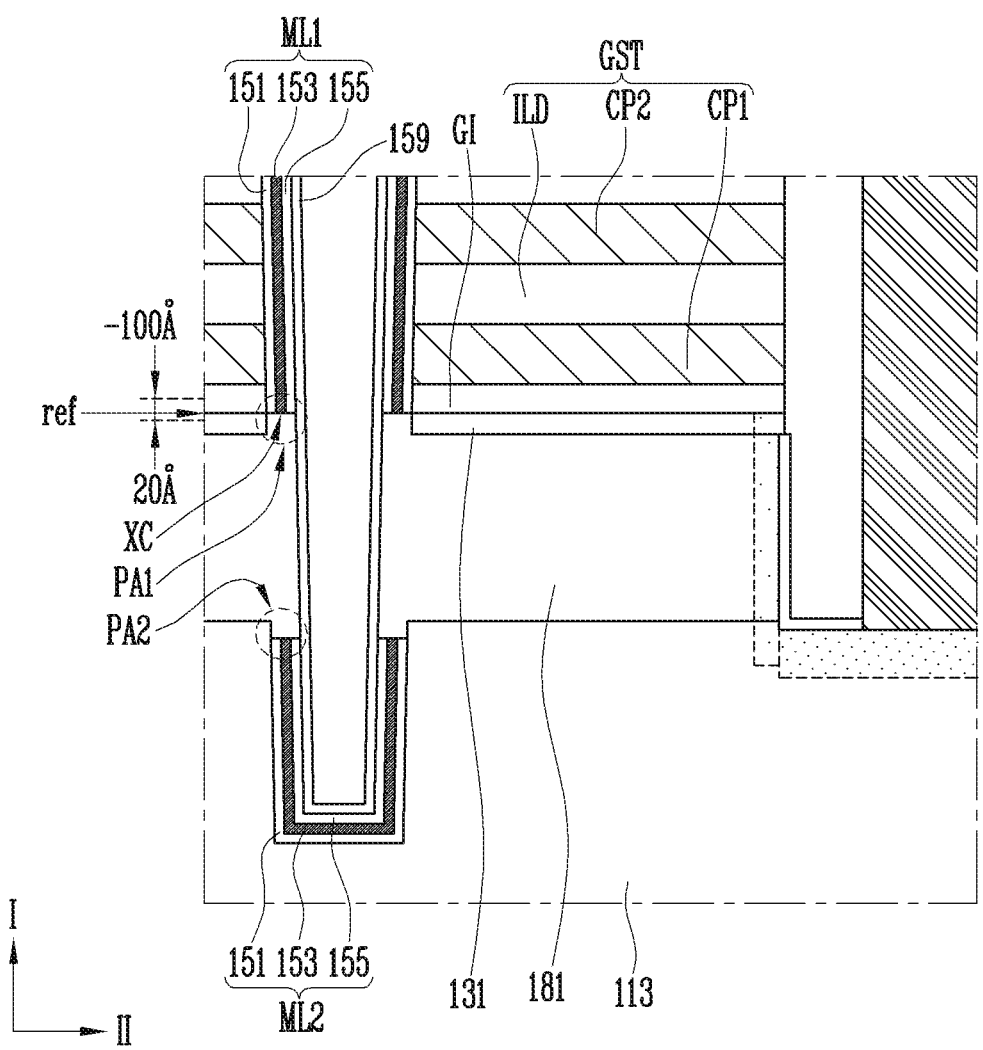

FIGS. 4A to 4C are enlarged cross-sectional diagrams of various embodiments illustrating an area B shown in FIG. 1.

Referring to FIGS. 4A to 4C, the position of the bottom surface XA, XB, or XC of the first multilayer memory pattern ML1 may be controlled to ensure improved erase current characteristics. Thus, the third doped semiconductor layer 181, which is disposed between the first doped semiconductor layer 113 and the second doped semiconductor layer 131, may be formed to include the first protrusion PA1.

Referring to FIG. 4A, the bottom surface XA of the first multilayer memory pattern ML1 may have a negative slope toward the gate stack structure GST from the channel pillar 159 in order to improve erase current characteristics. A top surface of the first protrusion PA1 which is coplanar with the bottom surface XA of the first multilayer memory pattern ML1 may have a positive slope toward the gate stack structure GST from the sidewall of the channel pillar 159.

Referring to FIG. 4B, the bottom surface XB of the first multilayer memory pattern ML1 may have a convex polygonal line shape or a convex shape in a direction from the gate stack structure GST toward the first semiconductor layer 113 in order to increase erase current. Hence, the top surface of the first protrusion PA1 which is coplanar with the bottom surface XB of the first multilayer memory pattern ML1 may have a concave polygonal shape or a concave shape in a direction from the gate stack structure GST toward the first semiconductor layer 113.

Referring to FIG. 4C, the bottom surface XC of the first multilayer memory pattern ML1 and the top surface of the first protrusion PA1 which are coplanar with each other may be flat to improve erase current characteristics.

Referring to FIGS. 4A to 4C, on the basis of the interface ref between the gate stack structure GST and the second semiconductor layer 131, a height measured from the interface ref in a direction toward the gate stack structure GST may be defined as "−" and a height measured from the interface ref in a direction toward the first semiconductor layer 113 may be defined as "+". The bottom surface XA, XB, or XC of the first multilayer memory pattern ML1 may be in a range between −100 Å to +20 Å on the basis of the reference (ref) in order to ensure an erase current. Preferably, manufacturing processes may be performed by setting the position of the bottom surface XA, XB, or XC of the first multilayer memory pattern ML1 at a height of about −50 Å from the reference (ref).

A multilayer memory layer including the tunnel insulating layer 155, the data storage layer 153, and the blocking insulating layer 151 may be separated into the first multilayer memory pattern ML1 and the second multilayer memory pattern ML2 by an etch process. According to process characteristics, the bottom surface XA, XB, or XC of the first multilayer memory pattern ML1 and the top surface of the second multilayer memory pattern ML2 may correspond to etch surfaces of the multilayer memory layer. In addition, the bottom surface XA, XB, or XC of the first multilayer memory pattern ML1 and the top surface of the second multilayer memory pattern ML2 may have symmetry with respect to each other. For example, when the bottom surface XC of the first multilayer memory pattern ML1 is flat, the top surface of the second multilayer memory pattern ML2 may also be flat and have symmetry with respect to the bottom surface XC of the first multilayer memory pattern ML1. In addition, according to process characteristics, the third semiconductor layer 181 may further include the second protrusion PA2 having symmetry with respect to the first protrusion PA1.

As described above with reference to FIG. 1, the gate stack structure GST may include the gate insulating layer GI, the conductive patterns CP1 and CP2, and the interlayer insulating layers ILD. The gate insulating layer GI may be disposed adjacent to the second semiconductor layer 131. The thickness of the second semiconductor layer 131 in the first direction I may be determined in consideration of process stability during the manufacture of the semiconductor device, and electrical characteristics of the semiconductor device.

FIGS. 5A to 5M are cross-sectional diagrams illustrating a manufacturing method for a semiconductor device according to an embodiment of the present invention. FIGS. 6A, 6B, and 6C are enlarged cross-sectional diagrams of an area C1 of FIG. 5C, an area C2 of FIG. 5E, and an area C3 of FIG. 5F, respectively. Though not shown in FIGS. 6A, 6B, and 6C, processes to be described below may be performed on a substrate where driving circuits are formed. For convenience of explanation, FIGS. 5A to 5M and 6A to 6C illustrate an example of a manufacturing method for a semiconductor device having the structure shown in FIG. 4C.

Figure 5A:
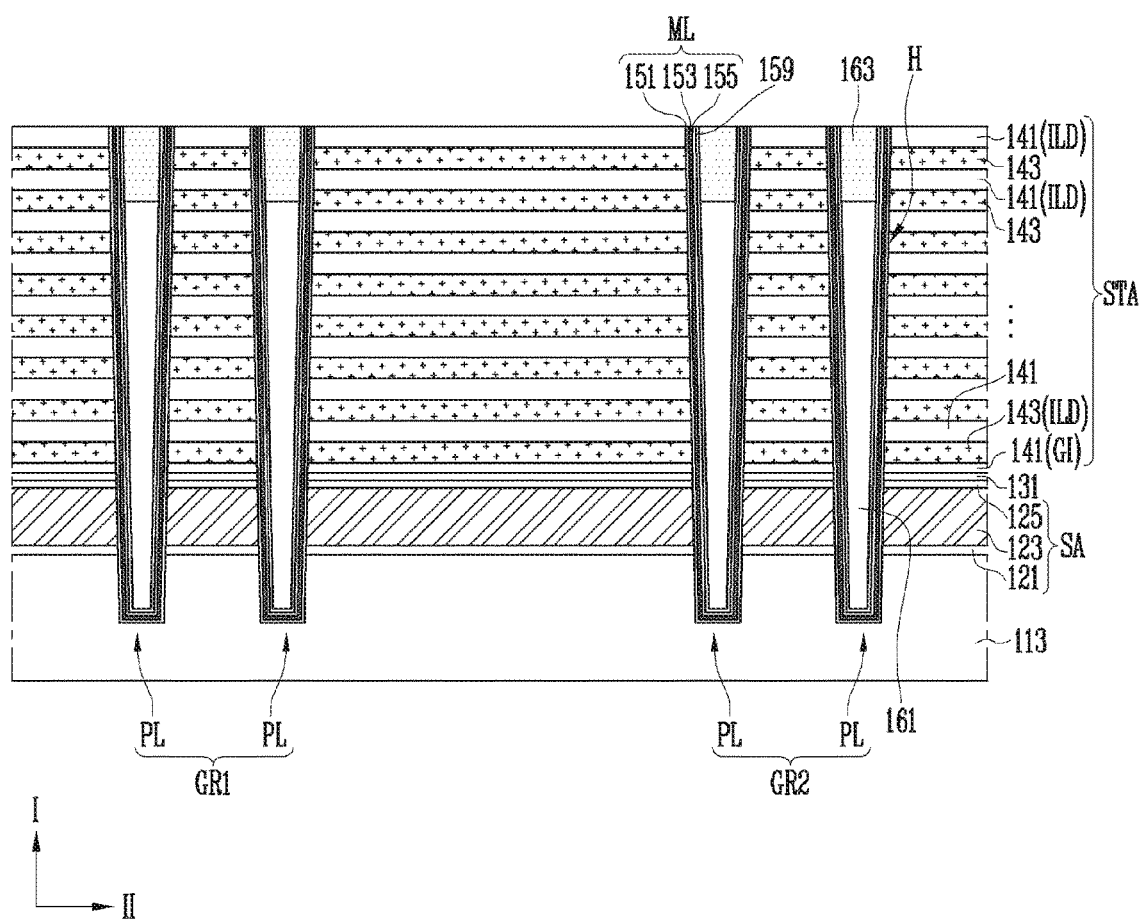
Figure 6A:
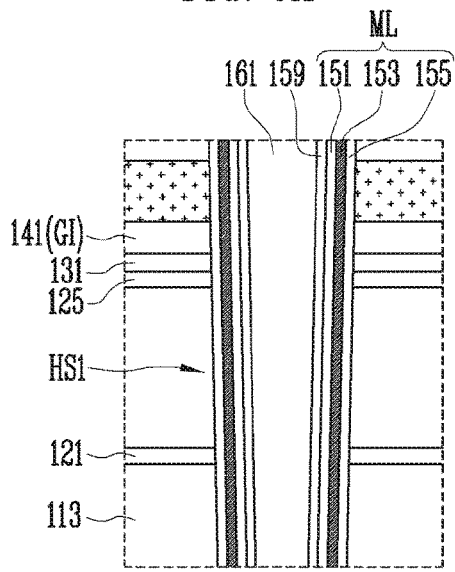
FIGS. 6A, 6B, and 6C are enlarged cross-sectional diagrams of an area C1 of FIG. 5C, an area C2 of FIG. 5E, and an area C3 of FIG. 5F, respectively.
Figure 6B:
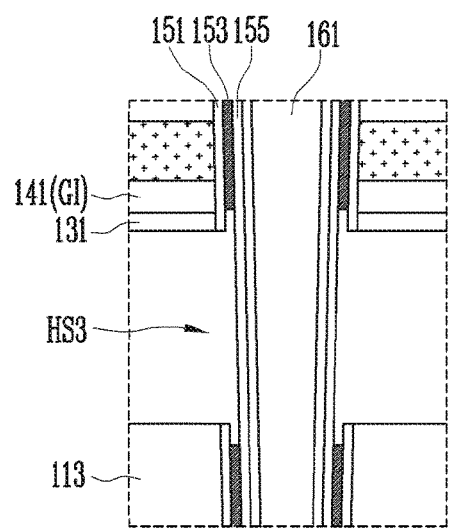
Figure 6C:
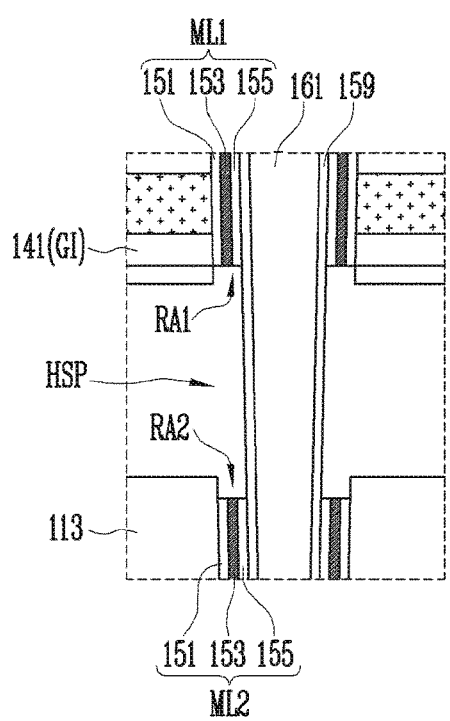

Referring to FIG. 5A, the first semiconductor layer 113, a sacrificial group SA and the second semiconductor layer 131 may be sequentially formed in the first direction I.

The first semiconductor layer 113 may include a dopant of a first conductivity type. The dopant of the first conductivity type may be a p-type dopant. For example, the first semiconductor layer 113 may be a p-type silicon layer. The dopant of the first conductivity type may be distributed at a higher concentration at a lower part in the first semiconductor layer 113 than at an upper part therein. The first semiconductor layer 113 may be formed by depositing a first undoped silicon layer, injecting the dopant of the first conductivity type into the first undoped silicon layer to form a first doped silicon layer, depositing a second undoped silicon layer onto the first doped silicon layer, and diffusing the dopant of the first conductivity type in the first doped silicon layer into the second undoped silicon layer to form a second doped silicon layer.

The second semiconductor layer 131 may include a dopant of a first conductivity type at a lower concentration than that of the first semiconductor layer 113, or may include an undoped semiconductor layer. More specifically, the second semiconductor layer 131 may include a p-type silicon layer or an undoped silicon layer.

The sacrificial group SA may include the first, second, and third sacrificial layers 121, 123, and 125 stacked sequentially from the first semiconductor layer 113 to the second semiconductor layer 131.

At least one of the first sacrificial layer 121 and the third sacrificial layer 125 may be omitted. The first sacrificial layer 121 may include an oxide layer serving as a protective layer for protecting the first semiconductor layer 113. The second sacrificial layer 123 may include a material layer which is different from the first sacrificial layer 121 and the third sacrificial layer 125. The second sacrificial layer 123 may include a material having a different etch rate from the first and second material layers 141 and 143 to be formed during subsequent processes. For example, the second sacrificial layer 123 may include a silicon layer, and the third sacrificial layer 125 may include an oxide layer as a protective layer for protecting the second semiconductor layer 131.

After the second semiconductor layer 131 is formed, a stacked body STA may be formed on the second semiconductor layer 131. The stacked body STA may include the first material layers 141 and the second material layers 143 stacked alternately with each other in the first direction I.

The second material layers 143 may include a different material from the first material layers 141. As a first example, the first material layers 141 may include an insulating material so as to be configured as the gate insulating layer GI and the interlayer insulating layer ILD, and the second material layers 143 may include a conductive material so as to be configured as conductive patterns. As a second example, the first material layers 141 may include an insulating material so as to be configured as the gate insulating layer GI and the interlayer insulating layer ILD, and the second material layers 143 may include a sacrificial insulating material having a different etch rate from the first material layers 141. More specifically, the first material layers 141 may be silicon oxide layers and the second material layers 143 may be silicon nitride layers. In a third example, the first material layers 141 may include a sacrificial conductive material having a different etch rate from the second material layers 143, and the second material layers 143 may include a conductive material so as to be configured as conductive patterns. More specifically, the first material layers 141 may include undoped silicon layers, and the second material layers 143 may include a doped silicon layer or a metal layer. For convenience of explanation, the second example is illustrated in the drawings.

The first material layers 141 may be divided into the gate insulating layer GI the closest to the second semiconductor layer 131 and the interlayer insulating layers ILD located above the gate insulating layer GI. The gate insulating layer GI may have a smaller thickness than the interlayer insulating layers ILD.

After the stacked body STA is formed, the cell plugs PL may be formed through the stacked body STA.

The cell plugs PL may be formed by forming the holes H, forming the multilayer memory layers ML, and forming the channel pillars 159.

The holes H may pass through the stacked body STA, the second semiconductor layer 131 and the sacrificial group SA and extend into the first semiconductor layer 113. Each of the first material layers 141, the second material layers 143, the second semiconductor layer 131, the third sacrificial layer 125, the second sacrificial layer 123, the first sacrificial layer 121 and the first semiconductor layer 113 may be partially etched, using, for example, a photolithography process.

The multilayer memory layers ML may be formed by stacking the blocking insulating layer 151, the data storage layer 153 and the tunnel insulating layer 155 in a sequential manner, and planarizing the blocking insulating layer 151, the data storage layer 153 and the tunnel insulating layer 155. Each of the blocking insulating layer 151, the data storage layer 153 and the tunnel insulating layer 155 may extend conformally along the surfaces of the holes H. After planarization, the multilayer memory layers ML remain only in the holes H.

Then, each of the channel pillars 159 may be formed on each of the multilayer memory layers ML. The channel pillars 159 may be formed by stacking semiconductor layers extending along the surfaces of the multilayer memory layers ML and planarizing the surface of the semiconductor layer. Each of the channel pillars 159 may be formed only in each of the holes H and surrounded by the multilayer memory layer ML. The channel pillars 159 may completely fill the holes H, or open central portions of the holes H. An undoped silicon layer may be formed as a semiconductor layer for forming the channel pillars 159.

When the central portions of the holes H is left open after the formation of the channel pillars 159, the central portion of each of the holes H may be filled with the core insulating layer 161. The core insulating layer 161 may have a smaller height than each of the holes H and each of the channel pillars 159 to allow for the capping pattern 163 to be formed on the core insulating layer 161. The capping pattern 163 may be formed of a semiconductor material and include a dopant of a second conductivity type. For example, the capping pattern 163 may include a doped silicon layer including an n-type dopant. The capping patterns 163 may not extend above the top surface of the channel layers 159, for example, by applying a planarization process after formation of the capping patterns 163. Any suitable planarization method may be employed.

The cell plugs PL may be divided into a first group GR1 and a second group GR2. The first group GR1 may include the channel pillars 159 in a plurality of columns. The second group GR2 may include the channel pillars 159 in a plurality of columns.

Through the processes as described above with reference to FIG. 5A, the channel pillars 159 may be formed. More specifically, each of the channel pillars 159 may be surrounded by the multilayer memory layer ML, pass thorough the stacked body STA and extend into the first semiconductor layer. The channel pillars 159 may be divided into the first group GR1 and the second group GR2. Each of the channel pillars 159 may serve as a channel area of memory cell transistors or select transistors. The multilayer memory layer ML may include the tunnel insulating layer 155, the data storage layer 153 and the blocking insulating layer 151 which are sequentially stacked on an outer wall of each of the channel pillars 159.

Figure 5B:
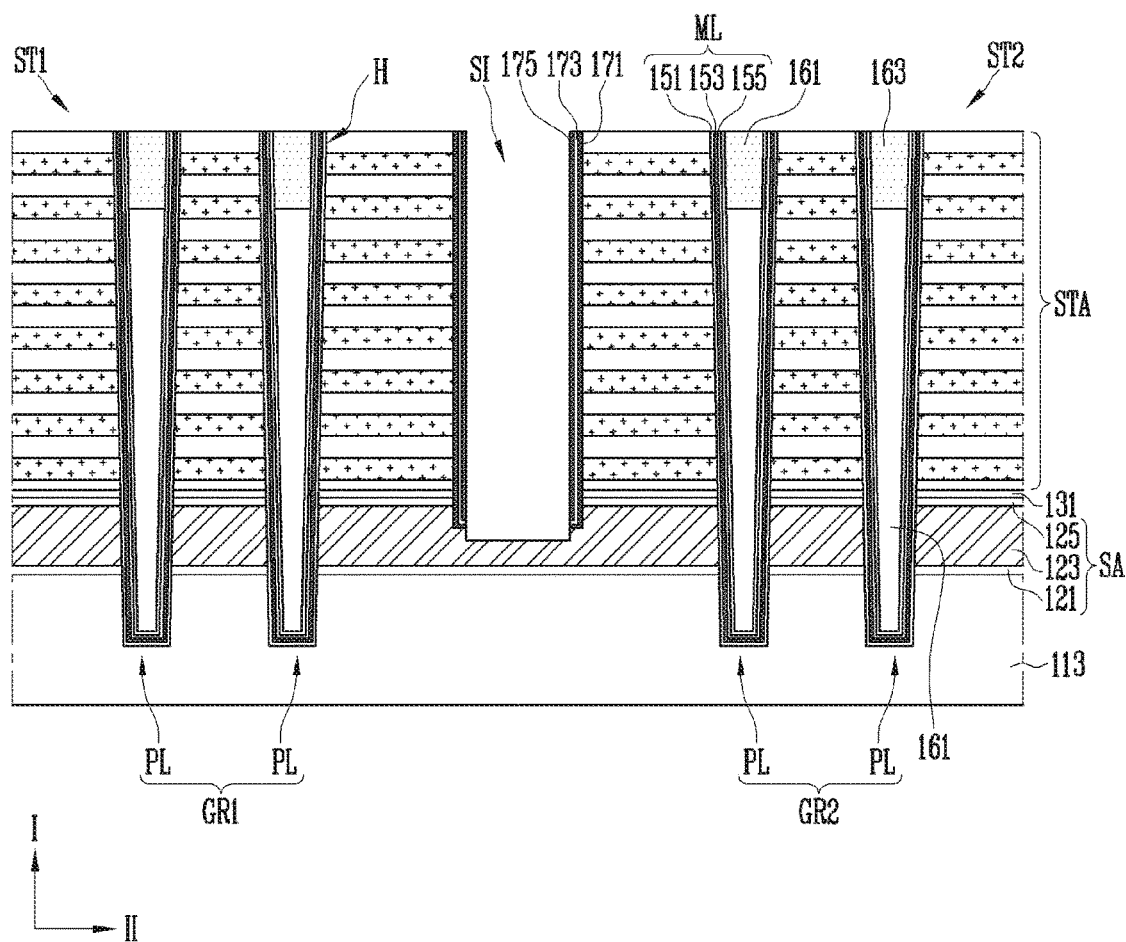

Referring to FIG. 5B, the slit SI may be formed through the stacked body STA between the first group GR1 and the second group GR2. The slit SI may pass through the stacked body STA and the second semiconductor layer 131 and extend into the sacrificial group SA. The slit SI may separate the stacked body STA and the second semiconductor layer 131 into a first structure ST1 surrounding the first group GR1 and a second structure ST2 surrounding the second group GR2.

The slit SI may completely pass through the third sacrificial layer 125 of the sacrificial group SA. The second sacrificial layer 123 of the sacrificial group SA may not be completely penetrated by the slit SI, but may be exposed through a bottom surface of the slit SI.

After the slit SI is formed, first, second, and third protective layers 171, 173, and 175 may be sequentially stacked on the surface of the slit SI. Subsequently, portions of the first, second, and third protective layers 171, 173, and 175 may be removed so that the second sacrificial layer 123 may be exposed through the bottom surface of the slit SI while the first, second, and third protective layers 171, 173, and 175 remain on the sidewall of the slit SI by performing, for example, any suitable etch-back process.

The first protective layer 171 may include an insulating material having a different etch rate from the blocking insulating layer 151. The second protective layer 173 may include an insulating material having a different etch rate from the data storage layer 153. The third protective layer 175 may include an insulating material having a different etch rate from the tunnel insulating layer 155. The first protective layer 171 and the third protective layer 175 may include the same material as the data storage layer 153. The second protective layer 173 may include an oxide layer.

Figure 5C:
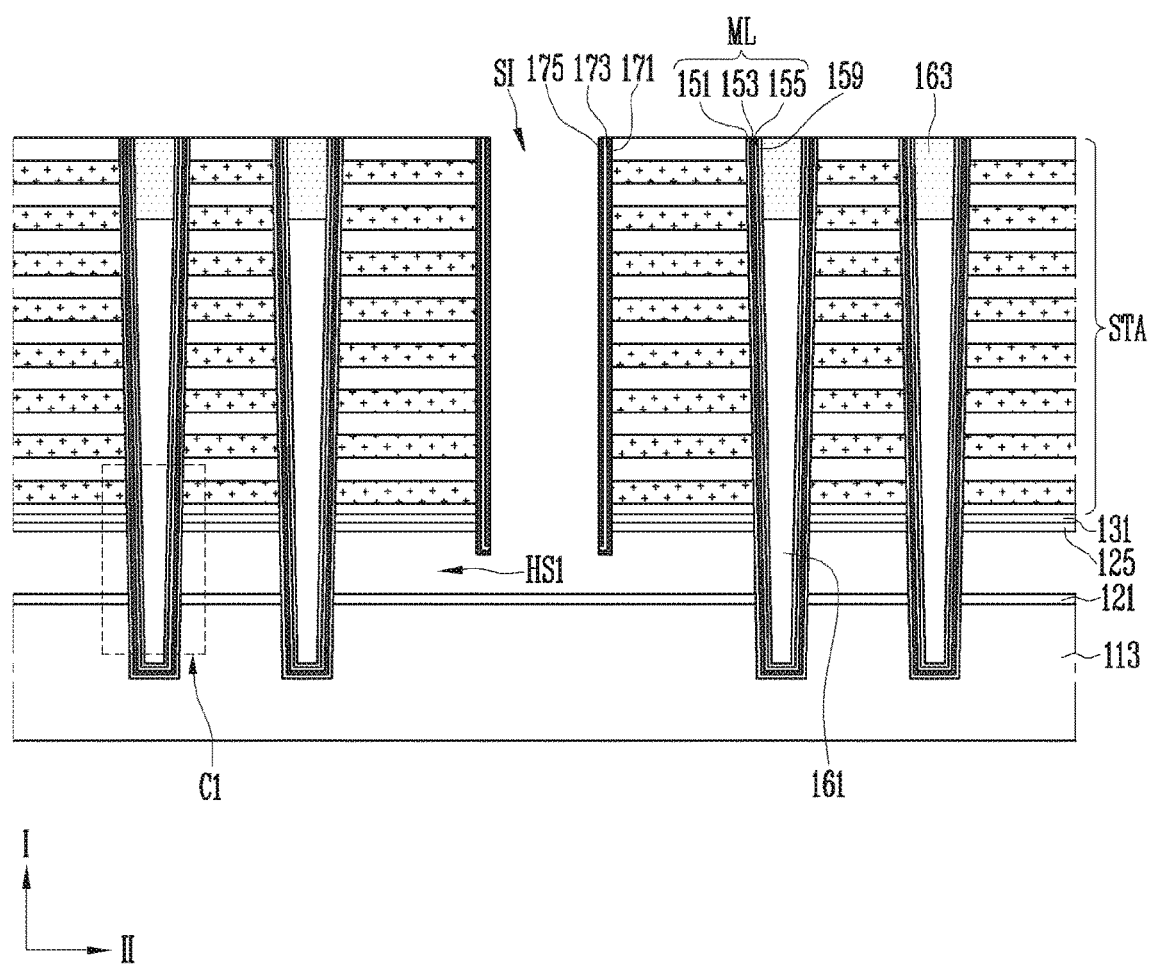

Referring to FIGS. 5C and 6A, a first opening HS1 may be formed by removing the second sacrificial layer 123 through the slit SI via etching. The first opening HS1 may be disposed between the first sacrificial layer 121 and third sacrificial layer 125, and expose the blocking insulating layer 151.

When the second sacrificial layer 123 is removed, the first semiconductor layer 113 and the second semiconductor layer 131 may be protected by the first sacrificial layer 121 and the third sacrificial layer 125 which have different etch rates from the second sacrificial layer 123. In addition, the stacked body STA may be protected by the first, second, and third protective layers 171, 173, and 175.

Figure 5D:
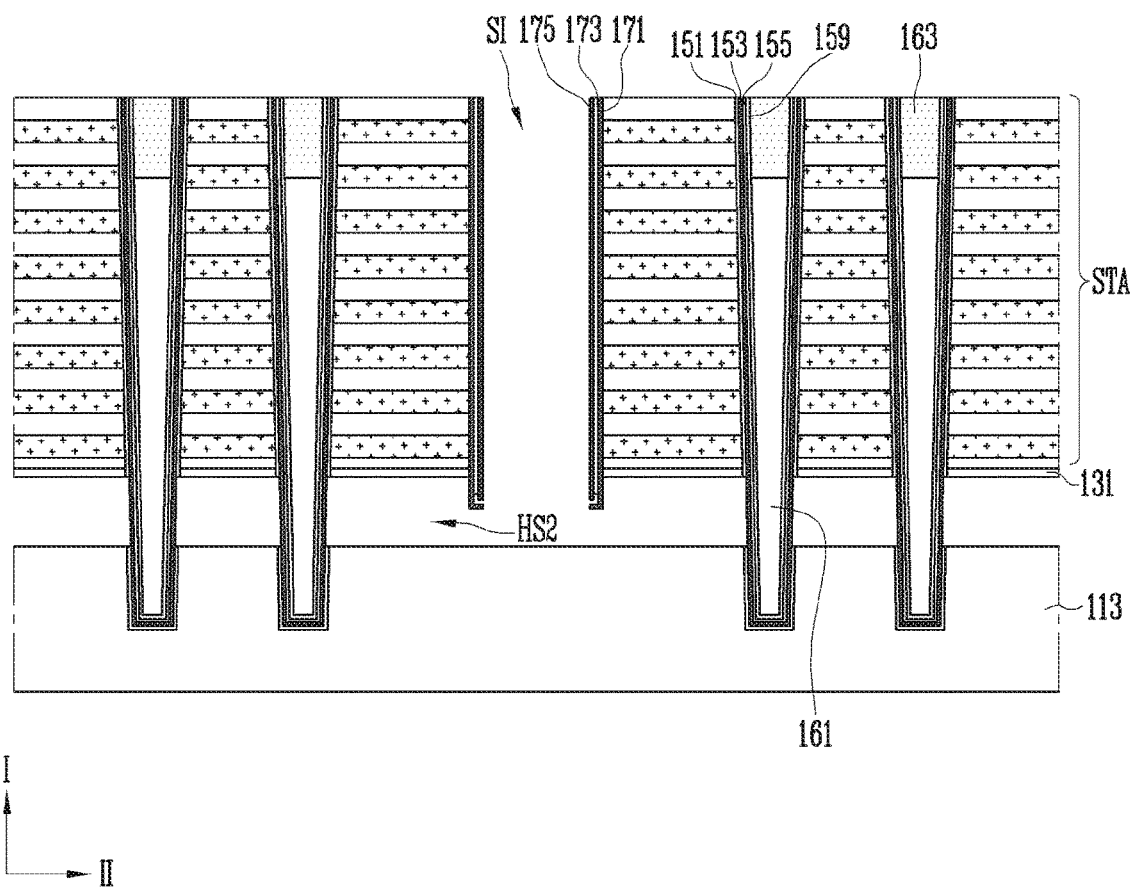

Referring to FIG. 5D, a second opening HS2 may be formed by partially removing the blocking insulating layer 151 through the first opening HS1. The data storage layer 153 may be exposed through the second opening HS2. When the second opening HS2 is formed, the first sacrificial layer 121 and the third sacrificial layer 125 may be removed, so that the first semiconductor layer 113 and the second semiconductor layer 131 may be exposed through the second opening HS2.

The first sacrificial layer 121 and the third sacrificial layer 125 may include oxide layers having different etch rates from the first semiconductor layer 113 and the second semiconductor layer 131, respectively. Therefore, according to an embodiment, the first sacrificial layer 121 and the third sacrificial layer 125 may be selectively etched by reducing damage to the first semiconductor layer 113 and the second semiconductor layer 131.

When the blocking insulating layer 151, the first sacrificial layer 121 and the third sacrificial layer 125 are etched, a portion of the second protective layer 173 adjacent to the second opening HS2 may be etched. On the other hand, when the second opening HS2 is formed, the third protective layer 175 having a different etch rate from the blocking insulating layer 151, the first sacrificial layer 121 and the third sacrificial layer 125 may remain without being removed to protect the stacked body STA.

Figure 5E:
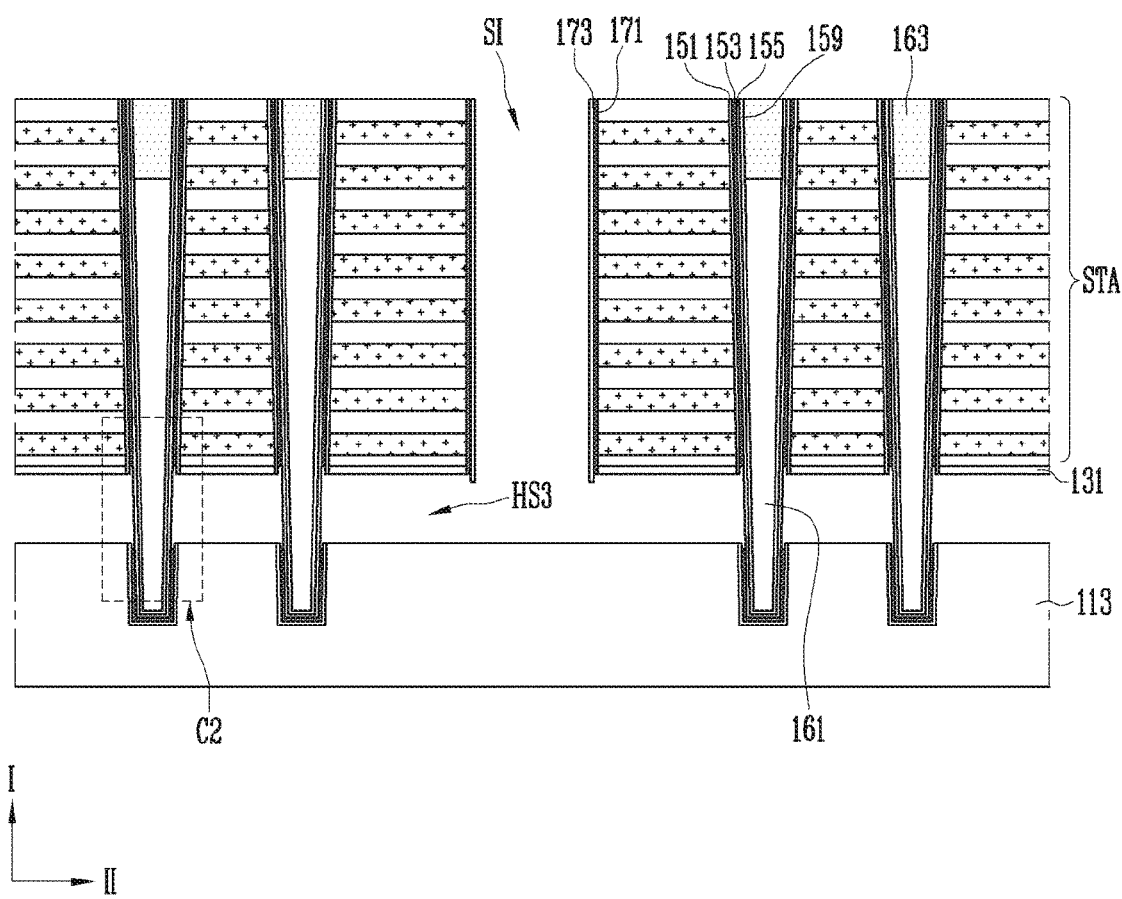

Referring to FIGS. 5E and 6B, a third opening HS3 may be formed by partially removing the data storage layer 153 through the second opening HS2, The tunnel insulating layer 155 may be exposed through the third opening HS3.

When the third opening HS3 is formed, an etch surface of the data storage layer 153 may be controlled to be adjacent to the interface between the second semiconductor layer 131 and the first material layer 141 configured as the gate insulating layer GI which is the lowermost layer of the stacked body STA. By controlling the etch surface of the data storage layer 153, the third opening HS3 may extend between the tunnel insulating layer 155 and the blocking insulating layer 151. In addition, another etch surface of the data storage layer 153 adjacent to the first semiconductor layer 113 may be lower than a top surface of the first semiconductor layer 113.

When the data storage layer 153 is etched, the third protective layer 175 may be removed to expose the second protective layer 173. Since the second protective layer 173 has a different etch rate from the data storage layer 153, when the data storage layer 153 is removed, the second protective layer 173 may remain without being removed to protect the stacked body STA.

Figure 5F:
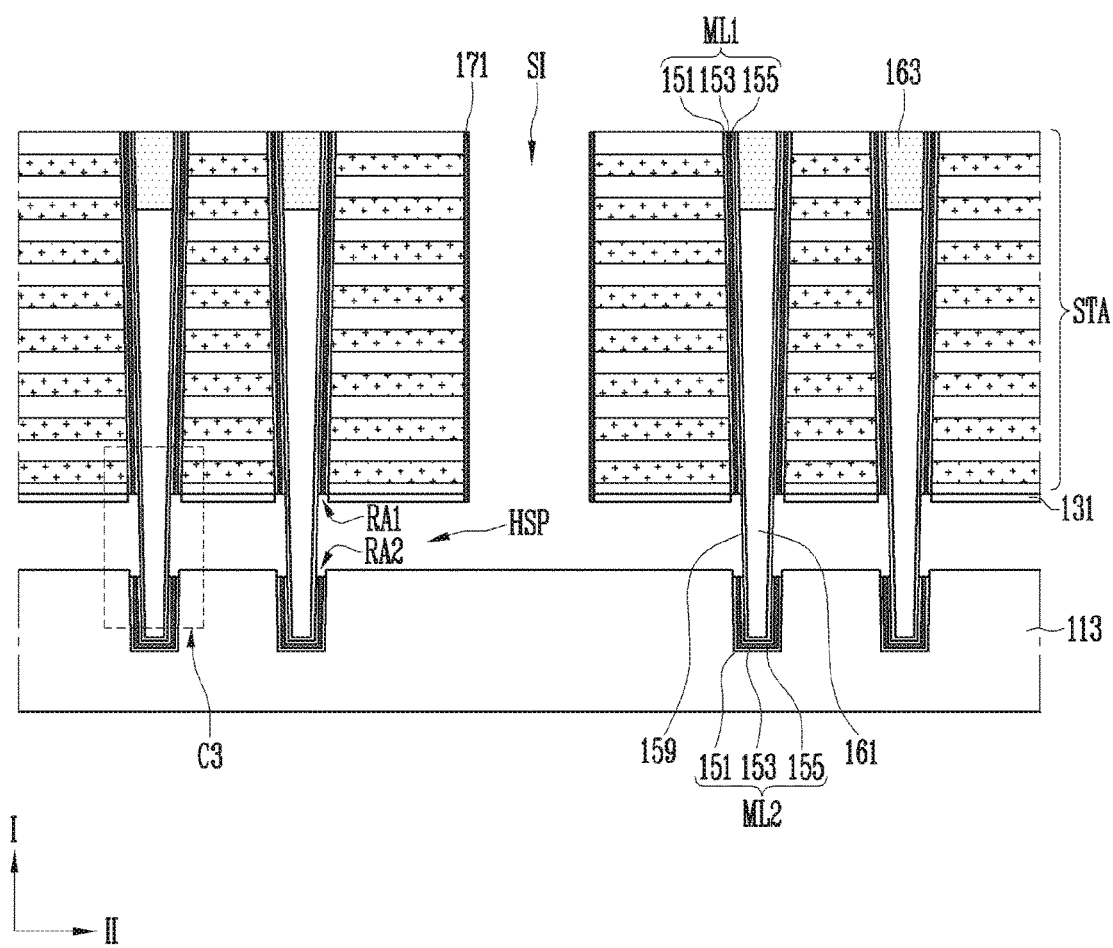

Referring to FIGS. 5F and 6C, the tunnel insulating layer 155 may be partially removed through the third opening HS3 to form the horizontal space HSP. The channel pillars 159 may be exposed through the horizontal space HSP.

When the tunnel insulating layer 155 is etched, the second protective layer 173 may be removed to expose the first protective layer 171. Since the first protective layer 171 has a different etch rate from the tunnel insulating layer 155, when the tunnel insulating layer 155 is removed, the first protective layer 171 may remain without being removed to protect the stacked body STA. Since the first semiconductor layer 113 and the second semiconductor layer 131 have different etch rates from the tunnel insulating layer 155, the first semiconductor layer 113 may remain without being etched when the tunnel insulating layer 155 is etched. As a result, the thickness of the first material layer 141 configured as the gate insulating layer GI which is the lowermost layer of the stacked body STA may be maintained.

When the horizontal space HSP is formed, the blocking insulating layer 151 may be partially etched. When the horizontal space HSP is formed, etch surfaces of the blocking insulating layer 151 and the tunnel insulating layer 155 may be controlled to be adjacent to the interface between the second semiconductor layer 131 and the first material layer 141 configured as the gate insulating layer GI which is the lowermost layer of the stacked body STA. Therefore, the horizontal space HSP may include first annular grooves RA1 defined between the second semiconductor layer 131 and the channel pillars 159. In addition, the horizontal space HSP may further include second annular grooves RA2 defined between the first semiconductor layer 113 and the channel pillars 159.

The second semiconductor layer 131 may have the smallest thickness which allows the second semiconductor layer 131 to serve as a protective layer in order to facilitate an etch process by which the first annular grooves RA1 may be disposed adjacent to the boundary between the second semiconductor layer 131 and the first material layer 141 configured as the gate insulating layer GI.

The multilayer memory layers may be divided into the first multilayer memory patterns ML1 between the stacked body STA and the channel pillars 159 and the second multilayer memory patterns ML2 between the channel pillars 159 and the first semiconductor layer 113 by the horizontal space HSP including the first annular grooves RA1 and the second annular grooves RA2.

By performing the etch processes as described above with reference to FIGS. 5C to 5F, the sacrificial group and a portion of each of the multilayer memory layers may be removed to expose a portion of each of the channel pillars 159 and form the horizontal space HSP including the first annular grooves RA1 and the second annular grooves RA2. In addition, as described above with reference to FIGS. 4A to 4C, an extension range of the first annular grooves RA1 may be controlled in consideration of the height that the first protrusions should have for improving the current for the erase operation.

Figure 5G:
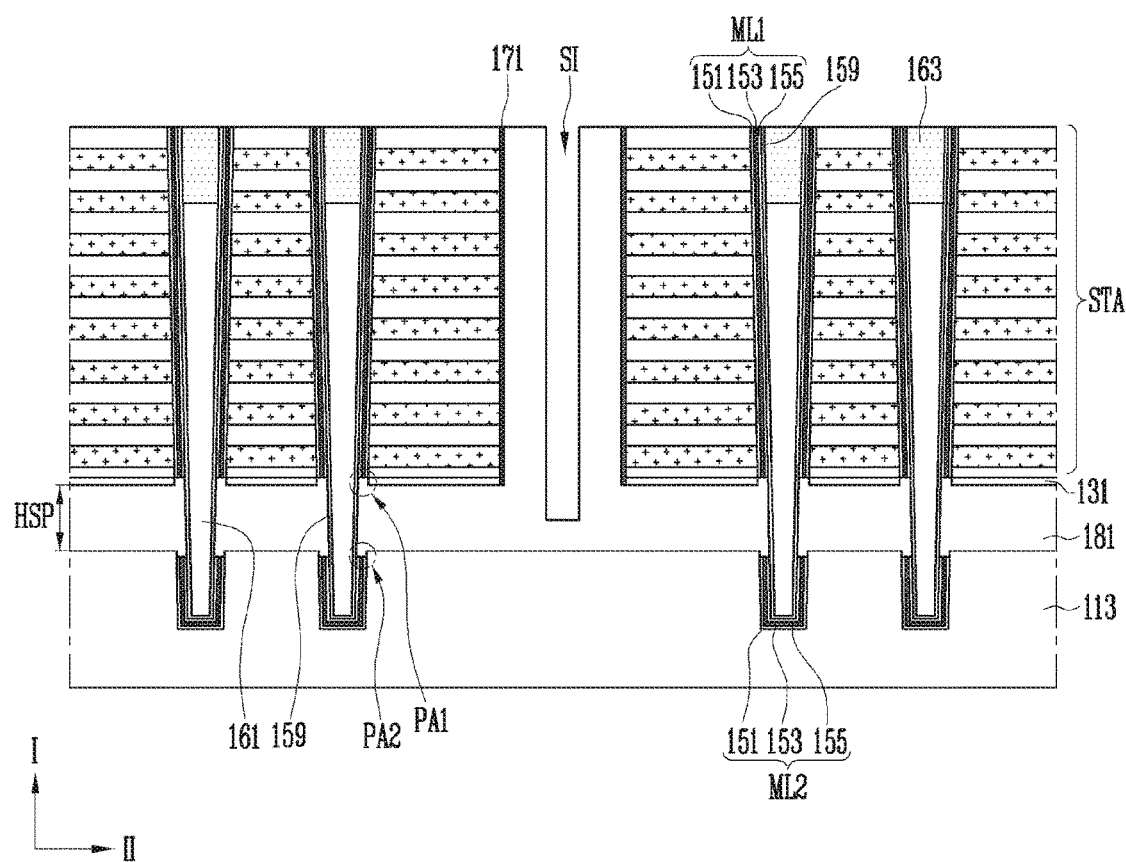

Referring to FIG. 5G, the third semiconductor layer 181 may be formed to fill the horizontal space HSP including the first annular grooves RA1 and the second annular grooves RA2 and contact the first and second semiconductor layers 113 and 131 and the channel pillars 159. The third semiconductor layer 181 may extend to an upper portion of the first protective layer 171 which remains on the sidewall of the slit SI.

The third semiconductor layer 181 may include a dopant of a first conductivity type. For example, the third semiconductor layer 181 may be a p-type doped silicon layer.

The third semiconductor layer 181 may be formed by a selective growth method (e.g., selective epitaxial growth (SEG)) using at least one of the channel pillar 159, the first semiconductor layer 113, and the second semiconductor layer 131. Alternatively, however, the third semiconductor layer 181 may be formed using a non-selective deposition method (e.g., chemical vapor deposition (CVD)). An undoped silicon layer may be formed by a selective growth method or a non-selective growth method, and the dopant of the first conductivity type may be diffused from the first semiconductor layer 113 into the undoped silicon layer, so that the third semiconductor layer 181 may be formed.

Portions of the third semiconductor layer 181 filling the first annular grooves RA1 may correspond to the first protrusions PA1 described above with FIGS. 1 to 4. Other portions of the third semiconductor layer 181 filling the second annular grooves RA2 may correspond to the second protrusions PA2 described above with FIGS. 1 and 4.

Figure 5H:
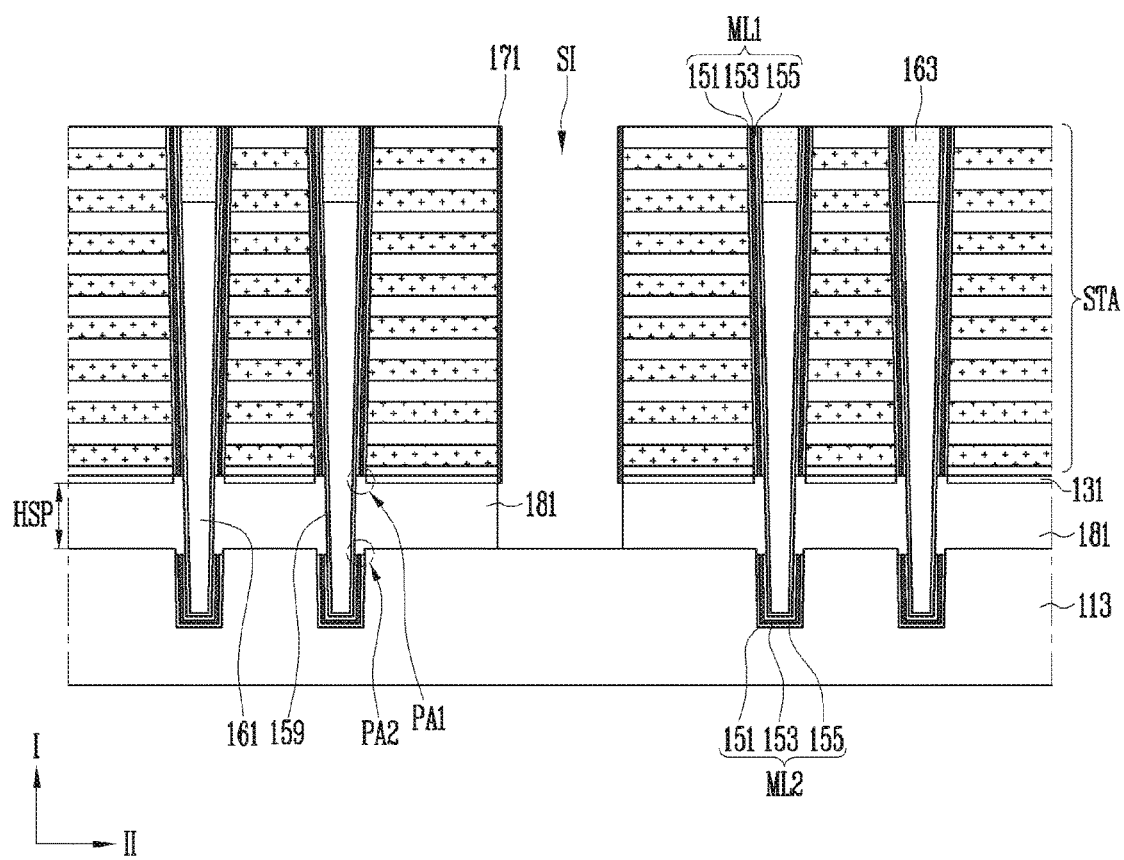

Referring to FIG. 5H, the third semiconductor layer 181 may be partially removed. A portion of the third doped semiconductor layer 181 which remains on the sidewall of the slit SI may be removed to expose the first protective layer 171. As a result, the slit SI may extend to pass through the third semiconductor layer 181, and the first semiconductor layer 113 may be exposed through the slit SI.

Figure 5I:
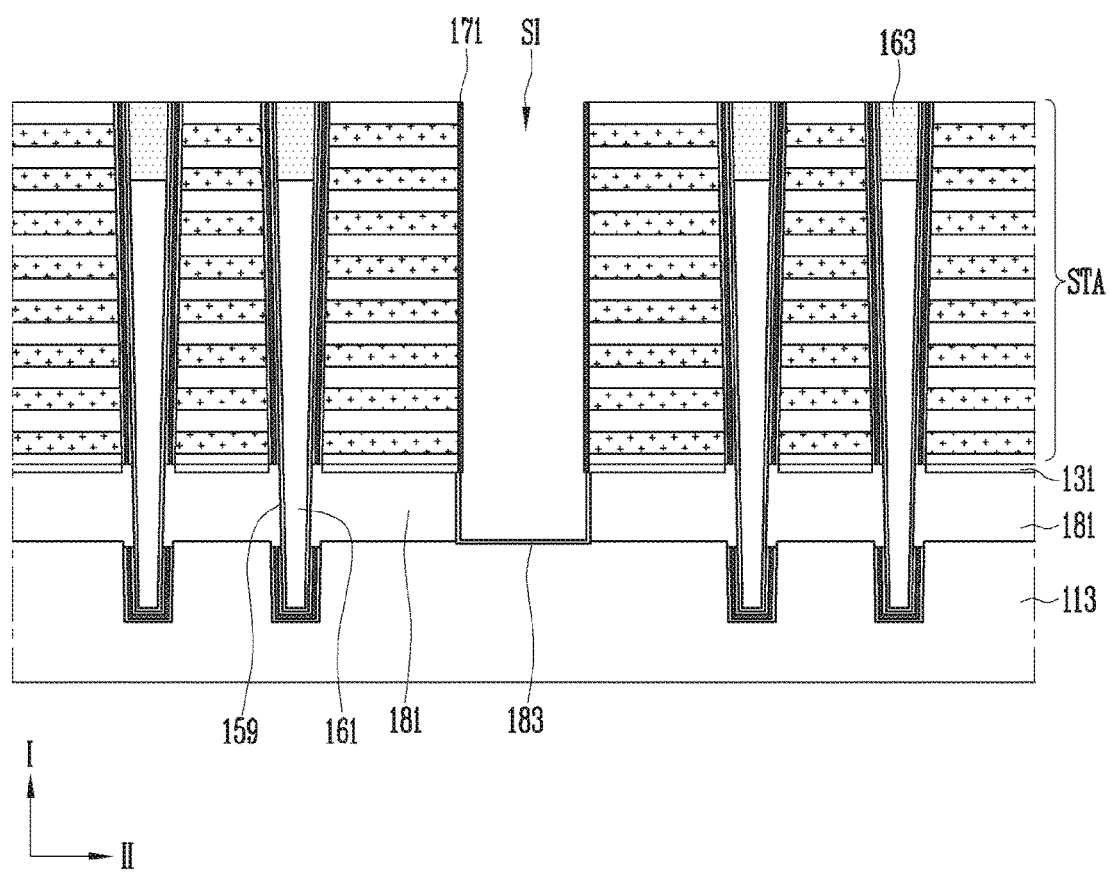

Referring to FIG. 5I, the buffer layer 183 may be formed on surfaces of the first and third semiconductor layers 113 and 181 which were exposed through the slit SI in the previous step. The buffer layer 183 may be an oxide layer and may be formed by oxidizing portions of the first and third semiconductor layers 113 and 181 exposed through the slit SI.

Referring to FIG. 5J, the first protective layer 171 remaining on the sidewall of the slit SI may then be removed.

After the first protective layer 171 is removed, subsequent processes may be performed by various methods according to properties of the first material layers and the second material layers. For example, as in the second example shown in FIG. 5A, when the first material layers include an insulating material configured as the gate insulating layer GI and the interlayer insulating layers ILD and the second material layer include a sacrificial insulating material, after the first protective layer 171 may be removed, a process may be performed to replace the second material layers with conductive patterns.

To replace the second material layers with the conductive patterns, first, the second material layers may be selectively removed to open gate areas 185.

Figure 5K:
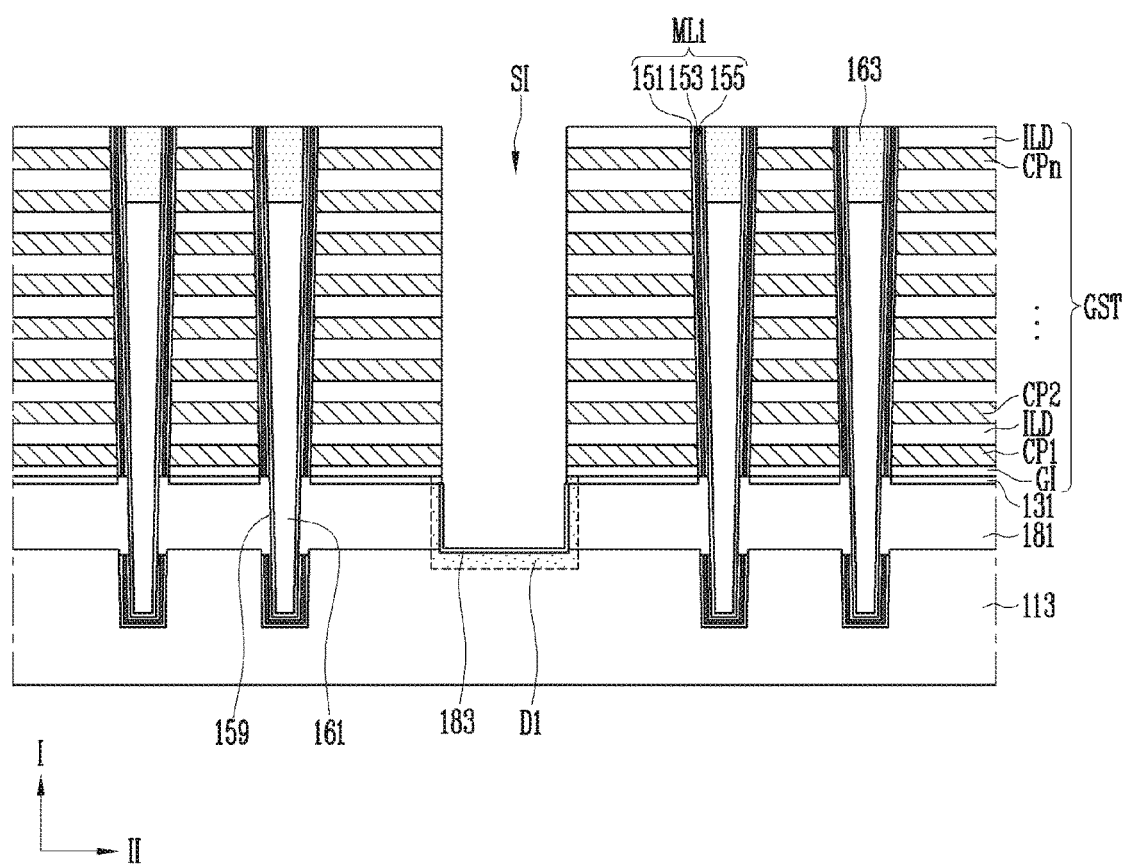

Referring to FIG. 5K, after the gate areas 185 are formed, the gate areas 185 may then be filled with the conductive patterns CP1 to CPn, respectively. The conductive patterns CP1 to CPn may be formed by forming a barrier metal layer extending along surfaces of the gate areas 185, forming a conductive layer thick enough to fill the gate areas 185 on the barrier metal layer, and the barrier metal layer and the conductive layer may be etched and separated into the conductive patterns CP1 to CPn.

By performing the processes described above with reference to FIGS. 5J and 5K, the gate stack structure GST having the insulating layers GI and ILD and the conductive patterns CP1 to CPn stacked alternately with each other may be formed.

However, in a variation of the manufacturing method, similarly to the first example described in FIG. 5A, when the first material layers include an insulating material configured as the gate insulating layer GI and the interlayer insulating layers ILD and the second material layers include the conductive patterns CP1 to CPn, a process of replacing the material layers through the slit SI may be omitted. In addition, the first material layers and the second material layers may be separated into the gate stack structures GST by forming the slit SI.

Alternatively, as in the third example described above in FIG. 5A, when the first material layers include a sacrificial conductive material and the second material layers include the conductive patterns CP1 to CPn, the first material layers may be replaced by the insulating layers GI and ILD through the slit SI.

Referring to FIG. 5K, after the gate stack structure GST is formed by the above-described various methods, the first region D1 including a dopant of a second conductivity type at a first concentration may be formed.

The first region D1 may be formed by injecting and diffusing the dopant of the second conductivity type into the first, second, and third semiconductor layers 113, 131, and 181. The dopant of the second conductivity type may be diffused into the third semiconductor layer 181 and the first semiconductor layer 113 adjacent to the buffer layer 183 and into the second semiconductor layer 131 adjacent to the slit SI. The dopant of the second conductivity type may be an n-type dopant. A plasma doping process or a tilt ion implantation process may be performed to form the first region D1.

Figure 5L:
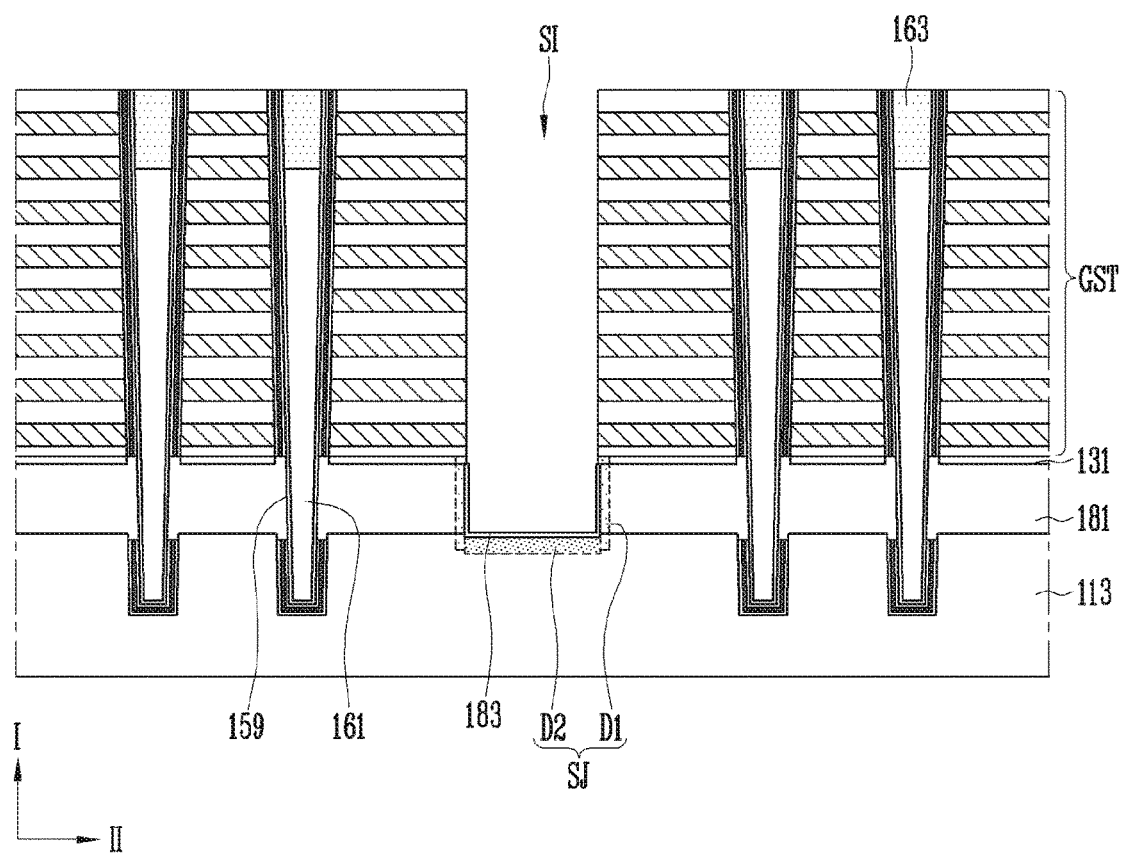

Referring to FIG. 5L, the second region D2 including a dopant of a second conductivity type at a second concentration higher than the first concentration may be formed.

The second region D2 may be formed by injecting and diffusing the dopant of the second conductivity type into the first semiconductor layer 113 adjacent to the buffer layer 183. The dopant of the second conductivity type may be an n-type dopant. The first region D1 may remain on a sidewall of the second region D2.

The first region D1 and the second region D2 may serve as the source junction SJ, and the first region D1 may serve as a lightly doped drain (LDD) region.

Figure 5M:
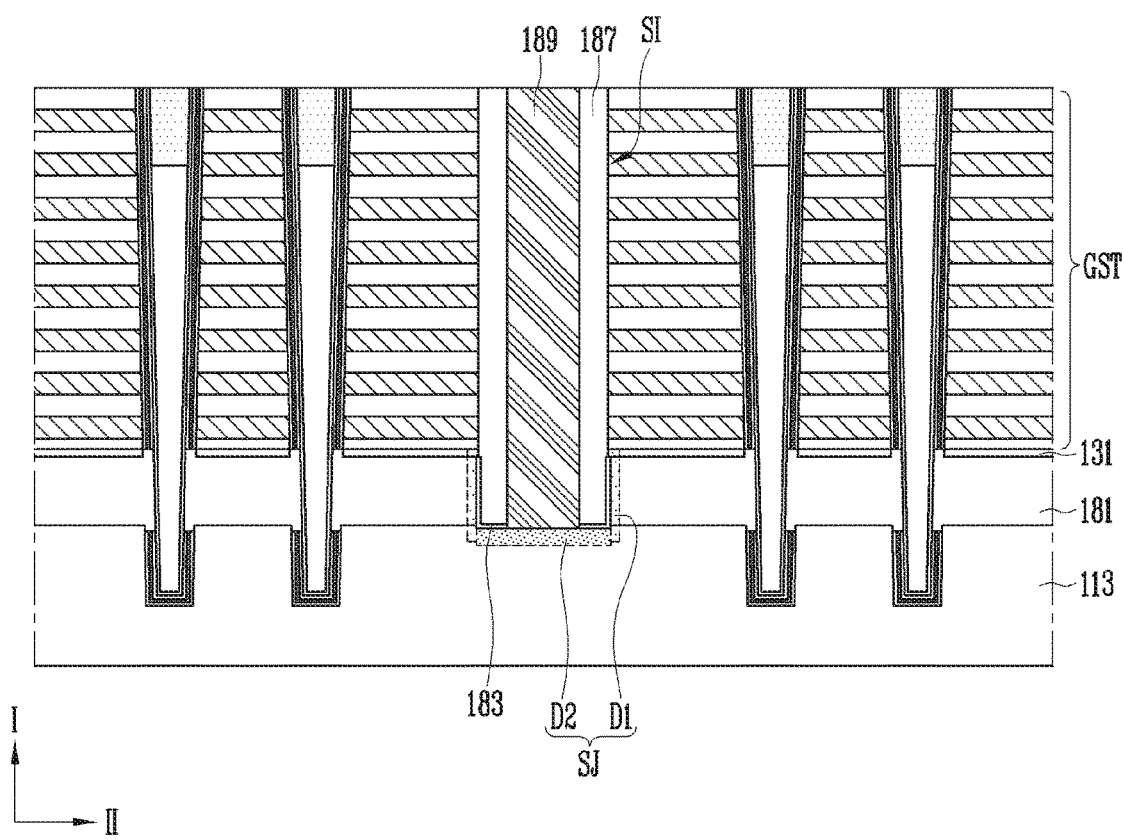

Referring to FIG. 5M, the spacer insulating layer 187 may be formed on the sidewall of the slit SI. Subsequently, the source contact layer 189 which fills the slit SI and passes through the buffer layer 183 to contact the second region D2 of the source junction SJ may be formed. The source contact layer 189 may include a single conductive layer, or multiple conductive layers.

The first multilayer memory pattern having the bottom surface as shown in FIGS. 4A and 4B may be formed by controlling an etch recipe for an etch process of the multilayer memory layer.

Figure 7:
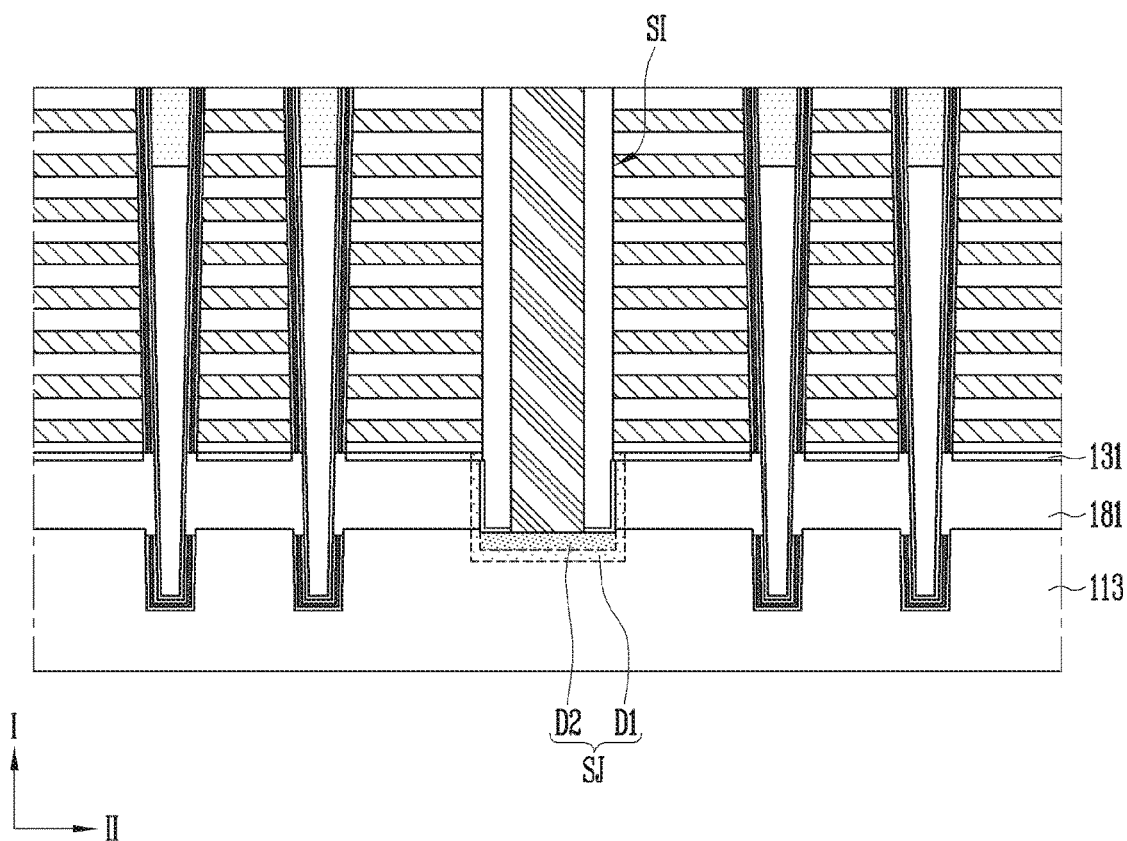
FIG. 7 is a cross-sectional diagram of a semiconductor device, according to an embodiment of the present invention.
Figure 8:
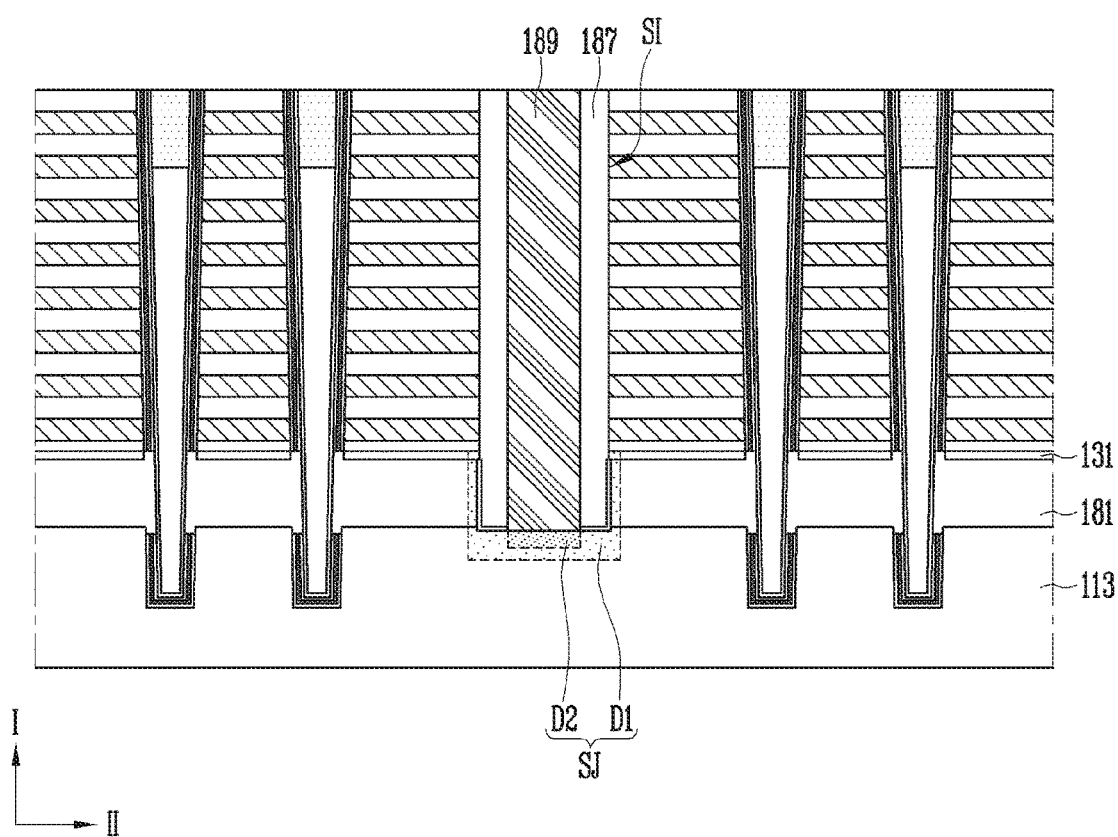
FIG. 8 is a cross-sectional diagram of a semiconductor device, according to an embodiment of the present invention.

FIGS. 7 and 8 are cross-sectional diagrams illustrating a semiconductor device according to other embodiments of the invention. FIGS. 7 and 8 illustrate modifications of the source junction SJ. The manufacturing methods described above with reference to FIGS. 5A to 5M may be used to form the semiconductor device shown in FIGS. 7 and 8. However, the method of forming the source junction SJ may be modified to form the semiconductor device shown in FIGS. 7 and 8. Hereinafter, for convenience of explanation, a description of common contents with the above descriptions with reference to FIGS. 5A to 5M is omitted.

Referring to FIGS. 7 and 8, the source junction SJ may include the first region D1 and the second region D2.

The first region D1 as shown in FIGS. 7 and 8 may include a dopant of a second conductivity type at a first concentration as described above with reference to FIG. 5K. The first region D1 as shown in FIGS. 7 and 8 may be formed in the first, second, and third semiconductor layers 113, 131, and 181 by the same processes as described above with reference to FIG. 5K. However, the first region D1 as shown in FIGS. 7 and 8 may be distributed in the first semiconductor layer 113 at a greater depth than that of the embodiment described with reference to FIG. 5K.

The second region D2 as shown in FIGS. 7 and 8 may include a dopant of a second conductivity type at a second concentration greater than the first concentration as described above with reference to FIG. 5L.

The second region D2 shown in FIG. 7 may be formed in the first semiconductor layer 113 adjacent to the slit SI by using the processes described above with reference to FIG. 5L. However, the second region D2 may be formed so that a diffusion range of the dopant used in the second region D2 is smaller than the diffusion range of dopant used for the first region D1 and the first region D1 remains surrounding the second region D2.

In FIG. 8, the second region D2 is formed after forming the spacer insulating layer 187, by injecting the dopant of the second conductivity type into the first semiconductor layer 113 through the slit SI before forming the source contact layer 189. A diffusion range of the second region D2 may be controlled so as not to fall out of that of the first region D1. Due to process characteristics, a width of the second region D2 shown in FIG. 8 may be smaller than that of the second region D2 shown in FIG. 7.

According to the present invention, the reliability of an erase operation of a semiconductor device may be improved by controlling the shape and height of the bottom surface of the first multilayer memory pattern of the semiconductor device. The shape and height of the first multilayer memory pattern can be made within desired ranges by forming a protrusion of the third semiconductor layer which protrudes inside the second semiconductor layer at an interface between a channel pillar and the second semiconductor layer.

Figure 9:
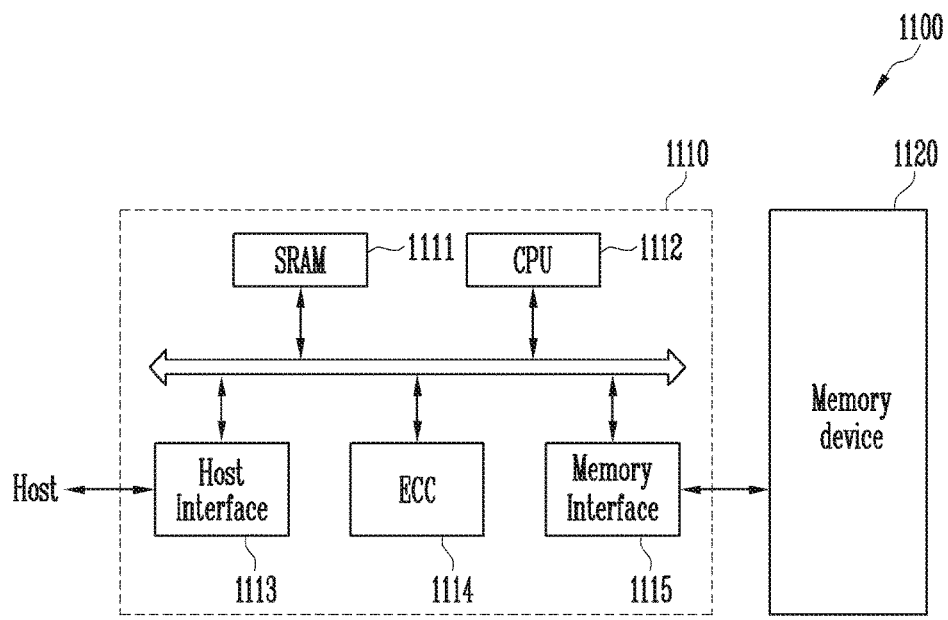
FIG. 9 is a block diagram illustrating a configuration of a memory system, according to an embodiment of the present invention.

FIG. 9 is a block diagram illustrating a memory system 1100 according to an embodiment.

Referring to FIG. 9, the memory device 1100 may include a memory device 1120 and a memory controller 1110.

The memory device 1120 may have the structure described above with reference to FIG. 1, 4A to 4C, 5M, 7, or 8. For example, the memory device 1120 may include the third semiconductor layer having the protrusions and first multilayer memory patterns having bottom surfaces having the prescribed shapes and heights which are found to be advantageous in improving the erase operations of the semiconductor memory device. The third semiconductor layer may be disposed between the first and second semiconductor layers and pass through the gate stack structure. The protrusion of the third semiconductor layer may be disposed between the second semiconductor layer and the channel pillar. The memory device 1120 may be a multi-chip package including a plurality of flash memory chips.

The memory controller 1110 may be configured to control the memory device 1120. The memory controller 1110 may include static random access memory (SRAM) 1111, a central processing unit (CPU) 1112, a host interface 1113, an error check and correction unit (ECC) 1114 and a memory interface 1115. The SRAM 1111 may function as an operation memory of the CPU 1112. The CPU 1112 may perform general control operations for data exchange with the memory controller 1110. The host interface 1113 may include a data exchange protocol for a host coupled to the memory system 1100. The ECC 1114 may detect and correct errors included in data read from the non-volatile memory device 1120. The memory interface 1115 may interface between the non-volatile memory device 1120 and the memory controller 1110. The memory controller 1110 may further include a read-only memory (ROM) that stores code data to interface with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with an external device (e.g., a host) through one of the interface protocols including Universal Serial Bus (USB), MultiMedia Card (MMC), Peripheral Component Interconnection-Express PCI-E( ) Serial Advanced Technology Attachment (SATA), Parallel Advanced Technology Attachment (PATA), Small Computer Small Interface (SCSI), Enhanced Small Disk Interface (ESDI), and Integrated Drive Electronics (IDE).

Figure 10:
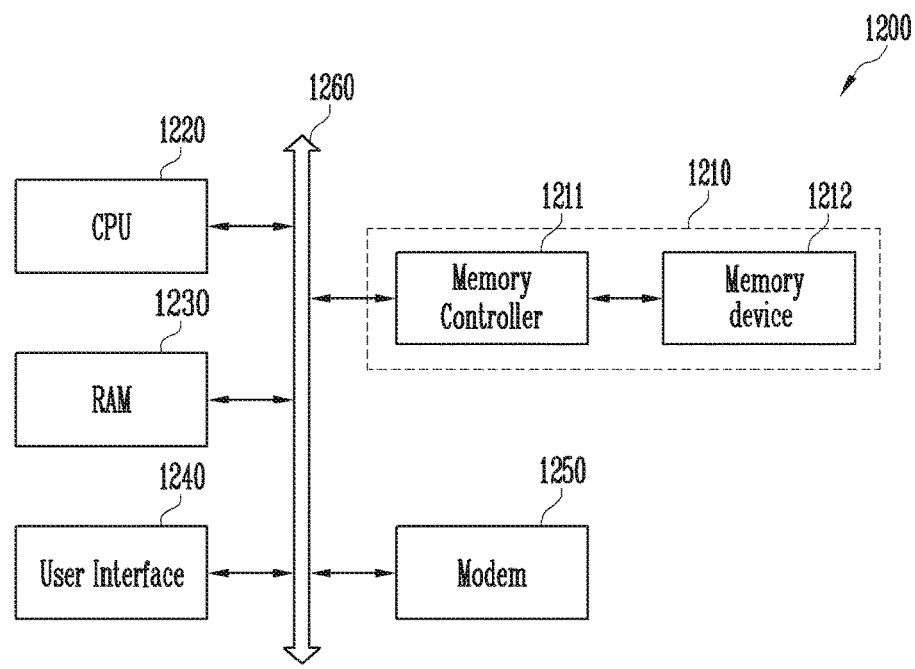
FIG. 10 is a block diagram illustrating a configuration of a computing system, according to an embodiment of the present invention.

FIG. 10 is a block diagram illustrating a configuration of a computing system 1200 according to an embodiment.

Referring to FIG. 10, the computing system 1200 according to an embodiment may include a CPU 1220, RAM 1230, a user interface 1240, a modem 1250 and a memory system 1210 that are electrically coupled to each other by a system bus 1260. In addition, when the computing system 1200 is a mobile device, a battery may be further included to apply an operating voltage to the computing system 1200. The computing system 1200 may further include application chipsets, a Camera Image Processor (CIS), or mobile DRAM.

The memory system 1210 may include a memory device 1212 and a memory controller 1211 as described above with reference to FIG. 9.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:
1. A semiconductor device, comprising:
a first semiconductor layer;
a second semiconductor layer spaced apart from the first semiconductor layer and disposed on the first semiconductor layer;
a gate stack structure disposed on the second semiconductor layer;
a third semiconductor layer positioned between the first and second semiconductor layers; and a channel pillar passing through the gate stack structure, the second semiconductor layer and the third semiconductor layer and extending into the first semiconductor layer;
wherein the third semiconductor layer is in contact with the channel pillar, and
wherein the third semiconductor layer includes a first protrusion protruding in an interface between the second semiconductor layer and the channel pillar.

2. The semiconductor device of claim 1, further comprising a first multilayer memory pattern surrounding the channel pillar, the first multilayer memory pattern having a bottom surface which is in contact with a top surface of the first protrusion of the third semiconductor layer.

3. The semiconductor device of claim 2, wherein the bottom surface of the first multilayer memory pattern is flat or horizontal.

4. The semiconductor device of claim 2, wherein the bottom surface of the first multilayer memory pattern has a negative slope in a direction from a sidewall of the channel pillar toward the gate stack structure.

5. The semiconductor device of claim 2, wherein the bottom surface of the first multilayer memory pattern has a convex polygonal line shape or a convex shape in a direction from the gate stack structure toward the first semiconductor layer.

6. The semiconductor device of claim 2, wherein the bottom surface of the first multilayer memory pattern is disposed between a first level and a second level, the first level being spaced by 100 Å from an interface between the gate stack structure and the second semiconductor layer toward the gate structure, the second level being spaced by 20 Å from the interface between the gate stack structure and the second semiconductor layer toward the first semiconductor layer.

7. The semiconductor device of claim 2, wherein the bottom surface of the first multilayer memory pattern is disposed between a first level and a second level, the first level being spaced by 50 Å from an interface between the gate stack structure and the second semiconductor layer toward the gate structure, the second level being spaced by 20 Å from the interface between the gate stack structure and the second semiconductor layer toward the first semiconductor layer.

8. The semiconductor device of claim 2, wherein the first multilayer memory pattern includes a tunnel insulating layer, a data storage layer and a blocking insulating layer stacked in a sequential manner from the channel pillar toward the gate stack structure.

9. The semiconductor device of claim 1, wherein each of the first and third semiconductor layers includes a p-type dopant.

10. The semiconductor device of claim 1, wherein the second semiconductor layer is an undoped semiconductor layer, or includes a p-type dopant.

11. The semiconductor device of claim 1, further comprising:
a spacer insulating layer extending along sidewalls of the gate stack structure, the second semiconductor layer, and the third semiconductor layer; and
a source contact layer formed on the spacer insulating layer and contacting the first semiconductor layer.

12. The semiconductor device of claim 11, further comprising a source junction defined in the first to third semiconductor layers and disposed adjacent to the spacer insulating layer and the source contact layer.

13. The semiconductor device of claim 12, wherein each of the first and third semiconductor layers includes a dopant of a first conductivity type, and
the source junction includes a dopant of a second conductivity type different from the first conductivity type.

14. The semiconductor device of claim 12, wherein the source junction includes an n-type dopant.

15. The semiconductor device of claim 12, wherein the source junction comprises:
a first region including a dopant of a second conductivity type at a first concentration; and
a second region including the dopant of the second conductivity type at a second concentration greater than the first concentration.

16. The semiconductor device of claim 15, wherein the second region is defined in the first semiconductor layer to contact the source contact layer, and
the first region is defined in the first semiconductor layer adjacent to a sidewall of the second region and in the second and third semiconductor layers adjacent to a sidewall of the source contact layer.

17. The semiconductor device of claim 1, wherein the gate stack structure comprises:
a gate insulating layer contacting the second semiconductor layer; and
conductive patterns and interlayer insulating layers stacked alternately on the gate insulating layer,
wherein the gate insulating layer has a smaller thickness than the interlayer insulating layers.

18. The semiconductor device of claim 1, wherein the third semiconductor layer further comprises:
a second protrusion protruding between the first semiconductor layer and the channel pillar; and
a second multilayer memory pattern disposed between the first semiconductor layer and the channel pillar to surround the channel pillar.

* * * * *